(12) United States Patent
Katou et al.

(10) Patent No.: US 10,947,326 B2
(45) Date of Patent: Mar. 16, 2021

(54) ADHESIVE COMPOSITION, CURED ARTICLE, SEMICONDUCTOR DEVICE, AND PRODUCTION METHOD FOR SAME

(71) Applicant: Hitachi Chemical Company, LTD., Tokyo (JP)

(72) Inventors: Sadaaki Katou, Tokyo (JP); Takuya Komine, Tokyo (JP); Shinjiro Fujii, Tokyo (JP)

(73) Assignee: SHOWA DENKO MATERIALS CO., LTD., Tokyo (JP)

( * ) Notice: Subject to any disclaimer, the term of this patent is extended or adjusted under 35 U.S.C. 154(b) by 0 days.

(21) Appl. No.: 15/747,967

(22) PCT Filed: Jul. 27, 2016

(86) PCT No.: PCT/JP2016/072060
§ 371 (c)(1),
(2) Date: Jan. 26, 2018

(87) PCT Pub. No.: WO2017/018459
PCT Pub. Date: Feb. 2, 2017

(65) Prior Publication Data
US 2018/0215842 A1    Aug. 2, 2018

(30) Foreign Application Priority Data

Jul. 29, 2015 (JP) .................................. 2015-150041

(51) Int. Cl.
*C08F 2/44* (2006.01)
*C08F 265/06* (2006.01)
(Continued)

(52) U.S. Cl.
CPC .............. *C08F 2/44* (2013.01); *C08F 265/06* (2013.01); *C09J 11/04* (2013.01); *C09J 11/06* (2013.01); *C09J 133/00* (2013.01); *C09J 151/003* (2013.01); *G02B 3/00* (2013.01); *G02B 7/025* (2013.01); *G02B 13/0085* (2013.01); *H01L 23/29* (2013.01); *H01L 23/31* (2013.01); *H01L 27/14627* (2013.01); *H01L 27/14685* (2013.01); *H01L 31/0203* (2013.01); *H01L 2224/48091* (2013.01); *H01L 2924/181* (2013.01)

(58) Field of Classification Search
CPC .... C08F 2/44; C08F 265/06; H01L 27/14627; H01L 31/0202
USPC ........................................................ 257/100
See application file for complete search history.

(56) References Cited

U.S. PATENT DOCUMENTS 4,968,559 A * 11/1990 Kuroda ................. H01L 21/302
428/354
2002/0156144 A1 * 10/2002 Williams ............. C08F 290/042
522/71
(Continued)

FOREIGN PATENT DOCUMENTS

CN    103013367 A    4/2013
JP    2005-142221 A    6/2005
(Continued)

*Primary Examiner* — Igwe U Anya
(74) *Attorney, Agent, or Firm* — Fitch, Even, Tabin & Flannery, L.L.P.

(57) ABSTRACT

An adhesive composition comprising (a) a (meth)acrylic polymer, (b) a compound having at least two (meth)acryloyl groups, (c) a polymerization initiator and (d) a filler.

19 Claims, 9 Drawing Sheets

(51) Int. Cl.
*H01L 27/146* (2006.01)
*H01L 31/0203* (2014.01)
*C09J 133/00* (2006.01)
*H01L 23/31* (2006.01)
*H01L 23/29* (2006.01)
*G02B 3/00* (2006.01)
*G02B 13/00* (2006.01)
*C09J 151/00* (2006.01)
*G02B 7/02* (2006.01)
*C09J 11/04* (2006.01)
*C09J 11/06* (2006.01)

(56) References Cited

U.S. PATENT DOCUMENTS

| | | | |
|---|---|---|---|
| 2005/0139828 A1 | 6/2005 | Maruyama et al. | |
| 2006/0040369 A1* | 2/2006 | Namgoong | B01J 19/0046 435/174 |
| 2007/0184212 A1* | 8/2007 | Nimura | G02B 5/3033 428/1.31 |
| 2008/0100780 A1* | 5/2008 | Suzuki | G02B 1/105 349/96 |
| 2009/0291301 A1* | 11/2009 | Okamoto | C09J 7/385 428/355 CN |
| 2010/0025791 A1 | 2/2010 | Ogawa et al. | |
| 2010/0164126 A1 | 7/2010 | Takahashi et al. | |
| 2012/0242940 A1* | 9/2012 | Nagata | G03F 7/033 349/106 |
| 2012/0321819 A1* | 12/2012 | Kim | C09J 133/08 428/1.1 |
| 2013/0078463 A1* | 3/2013 | Okamoto | C09J 133/08 428/354 |
| 2014/0296364 A1* | 10/2014 | Moszner | A61K 6/083 522/171 |
| 2014/0364530 A1* | 12/2014 | Lindekens | C08G 63/47 522/8 |
| 2015/0050432 A1* | 2/2015 | Ooga | C09J 4/00 428/1.54 |
| 2016/0237281 A1 | 8/2016 | Miyamoto et al. | |
| 2016/0340561 A1* | 11/2016 | Ikeda | C08F 220/18 |
| 2016/0355709 A1 | 12/2016 | Katou et al. | |

FOREIGN PATENT DOCUMENTS

| | | |
|---|---|---|
| JP | 2007-281375 A | 10/2007 |
| JP | 2008-277806 A | 11/2008 |
| JP | 2009-015309 A | 1/2009 |
| JP | 2010-040621 A | 2/2010 |
| JP | 2010-254869 A | 11/2010 |
| JP | 2013-028733 A | 2/2013 |
| JP | 2014-156585 A | 8/2014 |
| JP | 2014-156858 A | 8/2014 |
| JP | 2014-201705 A | 10/2014 |
| WO | 2015/046422 A1 | 4/2015 |
| WO | 2015/115537 A1 | 8/2015 |
| WO | 2015/115553 A1 | 8/2015 |
| WO | 2015/046422 A1 | 3/2017 |
| WO | 2015/115537 A1 | 3/2017 |
| WO | 2015/115553 A1 | 3/2017 |

\* cited by examiner (a)

(b)

(a)

(b)

(c)

ADHESIVE COMPOSITION, CURED ARTICLE, SEMICONDUCTOR DEVICE, AND PRODUCTION METHOD FOR SAME

CROSS-REFERENCE TO RELATED APPLICATIONS

This application is a U.S. national phase application filed under 35 U.S.C. § 371 of International Application PCT/JP2016/072060, filed on Jul. 27, 2016, designating the United States, which claims benefit of the filing date of JP 2015-150041, filed Jul. 29, 2015, which is hereby incorporated herein by reference in its entirety.

TECHNICAL FIELD

The present invention relates to an adhesive composition and a cured article thereof, and a semiconductor device using the adhesive composition and a production method thereof.

BACKGROUND ART

Recently, with the spread of digital still cameras and mobile phones attached with a camera, a solid-state imaging device has been reduced in power-consumption and miniaturized; and CMOS (Complementary Metal Oxide Semiconductor) image sensors have come to be used other than conventional CCD (Charge Coupled Device) image sensors. These image sensors have a sensor section (imaging pixel portion) consisting of a plurality of pixels two dimensionally arranged on a single semiconductor chip and a peripheral circuit section disposed around the sensor section.

As structures for a CMOS image sensor, a "surface illumination type" structure and a "backside illumination type" structure are known (see, for example, Patent Literatures 1 and 2 below). In the surface illumination type CMOS image sensor of Patent Literature 1, incident light from the outside passes through a glass substrate and a cavity, and enters each of microlenses; and light condensed by microlenses passes through a color filter layer and a wiring layer, and enters photodiodes. The light incident on these photodiodes is photoelectrically converted to generate signal charges, and electronic signals are generated from these signal charges to provide image data.

In contrast, in the backside illumination type CMOS image sensor of Patent Literature 2, photodiodes are formed on one of the surfaces of a semiconductor substrate, and color filter layers and microlenses are disposed on this surface. Above the microlenses, a glass substrate is disposed via an adhesive layer and a cavity. On the other surface of the semiconductor substrate, a wiring layer is disposed. According to this backside illumination type structure, since incident light on the microlenses is received by a light receiving section without passing through the wiring layer, light attenuation by the wiring layer is avoided and light receiving sensitivity is enhanced.

As the structure of the backside illumination type CMOS image sensor, a known structure is a structure constructed by disposing a glass substrate via an adhesive layer and a low refractive index layer on a silicon substrate having microlenses, wherein the adhesive layer is disposed at a peripheral portion so as not to cover the microlenses; and the low refractive index layer fills a cavity surrounded by the adhesive layer (see, for example, Patent Literature 3 below).

CITATION LIST

Patent Literature

Patent Literature 1: Japanese Unexamined Patent Publication No. 2007-281375
Patent Literature 2: Japanese Unexamined Patent Publication No. 2005-142221
Patent Literature 3: Japanese Unexamined Patent Publication No. 2010-40621

SUMMARY OF INVENTION

Technical Problem

In producing a semiconductor device such as optical parts, the properties required for an adhesive composition vary depending on the crafting technique or packaging structure. For example, in order to reduce optical loss, a cured article of an adhesive composition is required to have excellent transparency. In order to apply an adhesive composition to a limited narrow area alone at a high speed, an excellent viscosity (thixotropic index) available for a dispense method and the like is required.

The present invention was made in view of the above circumstance, and an object of the present invention is to provide an adhesive composition that can obtain a cured article having excellent transparency and that have an excellent viscosity. Another object of the present invention is to provide a cured article having excellent transparency. Another object of the present invention is to provide a semiconductor device using the adhesive composition and a production method thereof.

Solution to Problem

The present inventors conducted intensive studies and found that the objects can be attained by an adhesive composition comprising predetermined components, and therefore, the present invention was accomplished.

The present invention provides an adhesive composition comprising (a) a (meth)acrylic polymer, (b) a compound having at least two (meth)acryloyl groups, (c) a polymerization initiator, and (d) a filler.

According to the adhesive composition of the present invention, a cured article having excellent transparency can be obtained. The adhesive composition of the present invention has excellent viscosity, and it has thixotropic index suitable for a dispense method and the like. The adhesive composition of the present invention is excellent in peeling resistance during a reflow process (for example, 260° C.). According to the adhesive composition of the present invention, the refractive index of a cured article can be controlled within a preferable range.

It is preferable that the content of the component (d) relative to the total of 100 parts by mass of the component (a) and the component (b) is 0.1 to 40 parts by mass.

It is preferable that the average particle size of the component (d) is 5 to 10000 nm.

It is preferable that the component (a) has an alicyclic structure. Owing to this, the amount of the amorphous component in the (meth)acrylic polymer increases, and therefore, transparency tends to further enhance. In addition, glass-transition temperature (Tg) increases in comparison with an aliphatic structure (e.g., aliphatic structural unit) having the same number of carbon atoms, and therefore, the heat-resistant tends to be high.

It is preferable that the component (a) has an epoxy group. Owing to this, adhesiveness to substrate of an inorganic material such as a metal and glass can be improved.

The component (a) may have a structural unit represented by the following general formula (I):

[Chemical Formula 1]

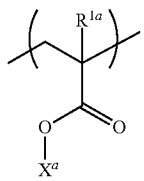

[In formula (I), $R^{1a}$ represents a hydrogen atom or a methyl group, and $X^a$ represents a group containing an epoxy group.]

The adhesive composition of the present invention can further comprise an antioxidant. Owing to this, coloring of the adhesive composition caused by deterioration during heating is suppressed and transparency during heating can be further improved.

The adhesive composition of the present invention may be used for optical parts. Since the adhesive composition of the embodiment is excellent in transparency and viscosity, it can be suitably used as a potting material. The adhesive composition of the present invention tends to have a larger refractive index than an air, and has high transparency after curing and excellent peeling resistance during a reflow process, and therefore, it can be suitably used for optical parts, and exhibits a particularly excellent effect for this use. It can be also suitably used as a sealing member for a light-emitting element (e.g., LED element) or a light-receiving element (e.g., CMOS element).

The present invention also provides a cured article of the above-mentioned adhesive composition.

The present invention further provides a method for producing a semiconductor device, comprising a step of forming an adhesive layer containing the above-mentioned adhesive composition on a semiconductor substrate, and a step of curing the adhesive layer in a state that the adhesive layer is disposed between the semiconductor substrate and a transparent base material. Since the above-mentioned adhesive composition has an excellent function as an adhesive and also has high transparency after curing, and therefore, a particularly excellent effect is exhibited by using this adhesive composition in a production process for a semiconductor device, and the resultant semiconductor device has satisfactory characteristics.

The present invention further provides a semiconductor device comprising a semiconductor substrate, an adhesive layer disposed on the semiconductor substrate, and a transparent base material bonded to the semiconductor substrate via the adhesive layer, wherein the adhesive layer contains the above-mentioned adhesive composition or a cured article thereof. Since the above-mentioned adhesive composition has an excellent function as an adhesive and also has high transparency after curing, and therefore, a particularly excellent effect is exhibited by using this adhesive composition, and the semiconductor device has satisfactory characteristics.

Advantageous Effects of Invention

According to the present invention, it is possible to provide an adhesive composition that can obtain a cured article having excellent transparency and that has excellent viscosity. According to the present invention, it is possible to provide a cured article having excellent transparency. According to the present invention, it is possible to provide a semiconductor device using the above-mentioned adhesive composition (for example, optical parts such as a solid-state imaging device) and a production method thereof.

The adhesive composition of the present invention and a cured article thereof can be used both in a structure which has an adhesive layer disposed at a peripheral portion on a substrate so as not to cover microlenses, wherein a cavity surrounded by the adhesive layer is filled with the adhesive composition or a cured article thereof; and in a structure which has the adhesive layer formed of the adhesive composition on the whole substrate.

According to the present invention, it is possible to provide a use of a resin composition (an adhesive composition) for a semiconductor device or a production method thereof. According to the present invention, it is possible to provide a use of a resin composition (an adhesive composition) for an optical part or a production method thereof. According to the present invention, it is possible to provide a use of a resin composition (an adhesive composition) for a solid-state imaging device or a production method thereof. According to the present invention, it is possible to provide a use of a cured article of a resin composition (an adhesive composition) for a semiconductor device. According to the present invention, it is possible to provide a use of a cured article of a resin composition (an adhesive composition) for an optical part. According to the present invention, it is possible to provide a use of a cured article of a resin composition (an adhesive composition) for a solid-state imaging device.

DESCRIPTION OF EMBODIMENTS

Figure 1:
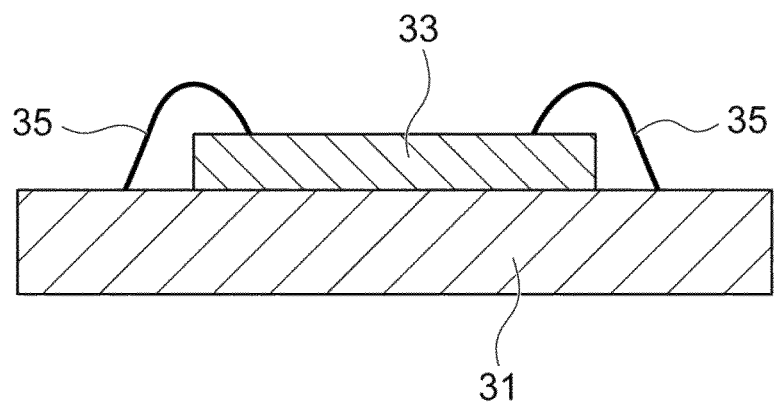
FIG. 1 is a process drawing showing an example of a method for producing a semiconductor device.
Figure 1:
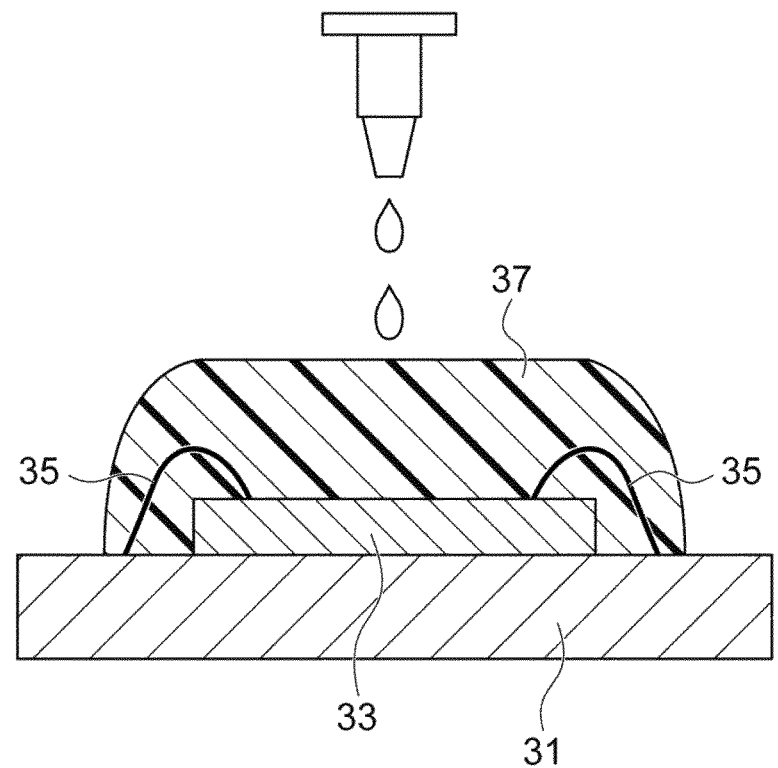

Now, embodiments of the present invention will be described below, but the present invention is not limited to these embodiments.

Note that, in the present specification, "(meth)acryloyl group" refers to at least one of an "acryloyl group" and the corresponding "methacryloyl group". The same applies to the other similar expressions such as "(meth)acrylate".

In the present specification, high "transparency" means good transmittance of visible light through a cured article of an adhesive composition, and means that interaction between visible light and the adhesive composition rarely occurs and absorption and scattering of electromagnetic waves rarely occur. According to the definition of JIS Z8120, the lower-limit wavelength of the electromagnetic wave corresponding to visible light is about 400 nm; whereas the upper limit thereof is about 760 nm. As the index of "transparency", an intensity ratio of incident light and transmitted light expressed by percentage can be used for transmissivity. The "refractive index" means to a relative refractive index based on the refractive index of air as 1.000.

In the present specification, a numerical range that has been indicated with the use of "to" indicates the range that includes the numerical values which are described before and after "to", as the minimum value and the maximum value, respectively. In the numerical ranges that are described stepwise in the present specification, the upper limit value or the lower limit value of the numerical range of a certain stage may be replaced with the upper limit value or the lower limit value of the numerical range of another stage. In the numerical ranges that are described in the present specification, the upper limit value or the lower limit value of the numerical value range may be replaced with the value shown in the examples. The terms "layer" and "film" include a structure having a shape which is formed on a part, in addition to a structure having a shape which is formed on the whole surface, when the layer and the film have been observed as a plan view. The term "step" includes not only an independent step but also a step by which an intended action of the step is achieved, though the step cannot be clearly distinguished from other steps. "A or B" may contain any one of A and B, and may contain both A and B. In the present specification, when a plurality of substances corresponding to each component exist in the composition, the content of each component in the composition means the total amount of the plurality of substances that exist in the composition, unless otherwise specified.

<Adhesive Composition and Cured Article>

The adhesive composition of the embodiment comprises (a) a (meth)acrylic polymer (hereinafter, sometimes referred to as "the component (a)"), (b) a compound having at least two (meth)acryloyl groups (hereinafter, sometimes referred to as "the component (b)"), (c) a polymerization initiator (hereinafter, sometimes referred to as "the component (c)") and (d) a filler (hereinafter, sometimes referred to as "the component (d)". The cured article of the embodiment is a cured article of the adhesive composition of the embodiment. The adhesive composition of the embodiment may be a liquid (varnish) or a film. The adhesive composition of the embodiment can be used as an adhesive composition for a semiconductor device, for example, it can be used as an adhesive composition for optical parts.

According to the adhesive composition of the embodiment, a thixotropic index suitable for a dispense method and the like can be obtained by using a filler as the component (d), in combination with the component (a), the component (b) and the component (c).

The (meth)acrylic polymer is usually expected to provide stress relaxation since it has rubber elasticity; however, it has low heat resistance itself, and therefore, it is considered that the (meth)the acrylic polymer is inappropriate as an adhesive for a semiconductor device obtained through a reflow step. In contrast, in the adhesive composition of the embodiment, a reduction of heat-resistance can be sufficiently suppressed by using a compound having at least two (meth) acryloyl groups in combination with the (meth)acrylic polymer. This is considered, because the heat resistance can be improved due to a three-dimensional cross linkage formed by the compound having at least two (meth)acryloyl groups.

In the adhesive composition of the embodiment, the compatibility between the (meth)acrylic polymer and the compound having at least two (meth)acryloyl groups tends to be high and the refractive indexes of them tend to be close, and therefore, excellent transparency can be obtained so as to obtain sufficient visibility after curing. In addition, since compatibility is high as mentioned above, phase separation rarely occurs in a varnish-like state or a semi-cured state, and therefore, storage stability is excellent. After radical curing, even if phase separation occurs due to heat at the time of curing, it is only micro-phase separation, and therefore, variation in properties of a cured article such as visibility and bonding strength can be suppressed. By filling the cavity with the adhesive composition of the embodiment, a problem of optical loss can be overcome.

((a) (Meth)Acrylic Polymer)

The "(meth)acrylic polymer" refers to a polymer having a structural unit derived from a monomer ((meth)acrylic monomer) having a (meth)acryloyl group, and examples thereof include a polymer (homopolymer) having a structure obtained by singularly polymerizing a (meth)acrylic monomer having a single (meth)acryloyl group in a molecule; a polymer (copolymer) having a structure obtained by copolymerizing two types or more of the (meth)acrylic monomers; and a polymer (copolymer) having a structure obtained by copolymerizing the (meth)acrylic monomer and other monomer. Examples of the monomer co-polymerizable with the (meth)acrylic monomer include a compound having two or more (meth)acryloyl groups in a molecule; a polymerizable compound having a single polymerizable unsaturated bond in a molecule and having no (meth) acryloyl group (for example, (meth)acrylonitrile, styrene, vinyl acetate and alkene (e.g., ethylene, propylene)); and a polymerizable compound having two or more polymerizable unsaturated bonds in a molecule and having no (meth) acryloyl group (e.g., divinylbenzene). The component (a) may be used alone or in combination of two or more.

From the viewpoint of obtaining further excellent transparency and heat-resistance, the component (a) contains preferably 30 to 100 mass % and more preferably 50 to 100 mass % of a structural unit derived from a (meth)acrylic monomer having a single (meth)acryloyl group in a molecule, based on the total amount of the component (a).

It is preferable that the component (a) has a functional group, for example, a structural unit having a functional group. In these cases, excellent stress relaxation property due to a low elastic modulus, peeling resistance during a reflow process, crack resistance, adhesiveness and heat-resistance can be easily exhibited. As the functional group, at least one selected from the group consisting of a carboxyl group, an acid anhydride group, a hydroxyl group, an amino group, an amide group, a phosphate group, a cyano group, a maleimide group and an epoxy group can be used. As the functional group, an epoxy group is preferable.

A method for introducing a functional group in a (meth) acrylic polymer is not particularly limited. For example, a functional group can be introduced in a (meth)acrylic polymer by subjecting a functional group-containing monomer having a functional group to random polymerization in accordance with an existing method described in International Publication No. WO2015/115537. In particular, suspension polymerization is preferable from the viewpoint that polymerization can be carried out at low cost.

The suspension polymerization is carried out in an aqueous solvent with a suspending agent. As the suspending agent, a nonionic water-soluble polymer is preferable from the viewpoint that an ionic impurities is less likely to remain in the resultant (meth)acrylic polymer. It is preferable that the used amount of the water-soluble polymer relative to the total of 100 parts by mass of the monomer is 0.01 to 1 part by mass.

In a polymerization reaction, an agent generally used such as a polymerization initiator and a chain transfer agent may be used. Examples of the polymerization initiator include the same compounds as those of the polymerization initiator (c) described later. Examples of the chain transfer agent include thiols such as n-octyl mercaptan.

It is preferable that the functional group-containing monomer contains at least one functional group selected from the group consisting of a carboxyl group, an acid anhydride group, a hydroxyl group, an amino group, an amide group, a phosphate group, a cyano group, a maleimide group and an epoxy group and at least one polymerizable carbon-carbon double bond, in a molecule.

It is preferable that the functional group is at least one selected from the group consisting of an amino group, an amide group, a phosphate group, a cyano group, a maleimide group and an epoxy group from the viewpoint that problems such as gelation of a varnish, clogging of a nozzle and the like during use, and formation of pinholes during spin coating are easily avoided. It is also preferable that the functional group is at least one selected from the group consisting of a carboxyl group, an acid anhydride group, a hydroxyl group, a phosphate group and an epoxy group from the viewpoint that coloring is more highly prevented. Further, in view of the aforementioned two points, the functional group is more preferably at least one selected from the group consisting of a phosphate group and an epoxy group, and further preferably an epoxy group.

As the functional group-containing monomer, it is possible to use compounds as described in International Publication No. WO2015/115537 such as a carboxyl group-containing monomer; an acid anhydride group-containing monomer; a hydroxyl group-containing monomer; an amino group-containing monomer; a phosphate group-containing monomer; a vinyl cyanide compound; a N-substituted maleimide; and an epoxy group-containing monomer. The functional group-containing monomer can be used alone or in combination of two or more.

Among them, an epoxy group-containing monomer such as glycidyl (meth)acrylate is particularly preferably used. Further, it is preferable that a (meth)acrylic polymer (for example, a glycidyl group-containing (meth)acrylic polymer) obtained by using such a monomer is compatible with a (meth)acrylic monomer or oligomer. The glycidyl group-containing (meth)acrylic polymer may be synthesized by a conventional method or a commercially available product may be used. Examples of the commercially available product include HTR-860P-3 (trade name, Nagase ChemteX Corporation). Such a (meth)acrylic polymer is preferable from the viewpoint that further excellent crack resistance, adhesiveness and heat-resistance can be exhibited, and excellent storage stability is easily obtained.

It is preferable that the content of the structural unit having a functional group falls within the following range based on the total amount of the component (a) from the viewpoint that not only adhesive force can be easily obtained but also gelation can be easily prevented. The content of the structural unit having a functional group is preferably 0.5 mass % or more, more preferably 0.8 mass % or more, further preferably 1.0 mass % or more, particularly preferably 2.0 mass % or more and extremely preferably 3.0 mass % or more. The content of the structural unit having a functional group is preferably 20 mass % or less, more preferably 10 mass % or less, further preferably 6.0 mass % or less and particularly preferably 5.0 mass % or less. From these viewpoints, the content of the structural unit having a functional group is preferably 0.5 to 20 mass %, more preferably 0.5 to 10 mass %, further preferably 0.5 to 6.0 mass %, particularly preferably 0.5 to 5.0 mass %, extremely preferably 0.8 to 5.0 mass %, very preferably 1.0 to 5.0 mass %, further more preferably 2.0 to 5.0 mass % and further preferably 3.0 to 5.0 mass %.

The component (a) may have a structural unit having a nitrogen atom-containing group. The content of the structural unit having a nitrogen atom-containing group in the component (a) based on the total amount of the component (a) is preferably 5 mass % or less, more preferably 3 mass % or less and further preferably 1 mass % or less. It is particularly preferable that the component (a) does not contain a structural unit having a nitrogen atom-containing group. Examples of the nitrogen atom-containing group include an amino group, an amide group, a cyano group and a maleimide group. Examples of the structural unit having a nitrogen atom-containing group include a structural unit derived from a nitrogen atom-containing monomer among the functional group-containing monomers as mentioned above, for example, a structural unit derived from a vinyl cyanide compound such as (meth)acrylonitrile.

Examples of the monomer other than the functional group-containing monomer, that can be used in synthesizing the component (a), include those as described in International Publication No. WO2015/115537 such as (meth)acrylic esters; an aromatic vinyl compound; and an alicyclic monomer. The monomer other than the functional group-containing monomer may be used alone or in combination of two or more.

Among them, (meth)acrylic esters are preferable from the viewpoint that a (meth)acrylic polymer (for example, a (meth)acrylic polymer having a weight average molecular weight of 100000 or more) is easily synthesized without gelation. Among the (meth)acrylic esters, at least one selected from the group consisting of ethyl (meth)acrylate, butyl (meth)acrylate and 2-ethylhexyl (meth)acrylate is more preferable from the viewpoint that it can be excellently co-polymerizable with a functional group-containing monomer.

The component (a) preferably has at least one selected from the group consisting of an alicyclic structure and a heterocyclic structure, and more preferably has an alicyclic structure. For example, the component (a) preferably has a structural unit having at least one selected from the group consisting of an alicyclic structure and a heterocyclic structure, and more preferably has a structural unit having an alicyclic structure. Examples of the monomer having an alicyclic structure or a heterocyclic structure for use in producing a (meth)acrylic polymer having a structural unit having an alicyclic structure or a heterocyclic structure include compounds represented by the following general formula (1).

[Chemical Formula 2]

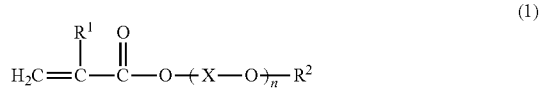

(1)

[In formula (1), $R^1$ represents a hydrogen atom or a methyl group, $R^2$ represents an alicyclic group or a heterocyclic group, X represents an alkylene group having 1 to 6 carbon atoms, and n represents an integer of 0 to 10; if n is an integer of 2 or more, a plurality of X may be the same or different; and the "alicyclic group" herein refers to a group having a cyclic structure formed by connecting carbon atoms; the "heterocyclic group" refers to a group having a cyclic structure formed by connecting carbon atoms and 1 or more hetero atoms.]

Examples of $R^2$ include groups represented by the following formulas (2a) to (2h).

[Chemical Formula 3]

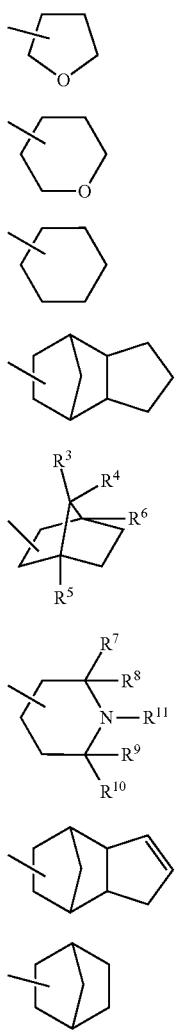

(2a)
(2b)
(2c)
(2d)
(2e)
(2f)
(2g)
(2h)

[In the formulas, $R^3$, $R^4$, $R^5$, $R^6$, $R^7$, $R^8$, $R^9$ and $R^{10}$ each independently represent a hydrogen atom or an alkyl group having 1 to 4 carbon atoms, $R^{11}$ represents a hydrogen atom, an alkyl group having 1 to 4 carbon atoms or a structure represented by $OR^{11a}$, and $R^{11a}$ represents a hydrogen atom or an alkyl group having 1 to 8 carbon atoms.]

Examples of the compound represented by formula (1) include cyclohexyl (meth)acrylate, isobornyl (meth)acrylate and tricyclo[5.2.1.0$^{2,6}$]decan-8-yl (meth)acrylate (alias: tricyclo[5.2.1.0$^{2,6}$]decyl (meth)acrylate).

The content of these monomers other than functional group-containing monomers is not particularly limited; however, it is preferably adjusted so that Tg of the component (a) falls within the range of −50 to 50° C. For example, by using 2.5 mass % of glycidyl methacrylate, 43.5 mass % of methyl methacrylate, 18.5 mass % of ethyl acrylate and 35.5 mass % of butyl acrylate as monomers, an epoxy group-containing (meth)acrylic polymer having Tg of 12° C. and a weight average molecular weight of 100000 or more can be synthesized as the component (a).

The mixing ratio when functional group-containing monomers are used in combination is determined in consideration of Tg of a (meth)acrylic polymer, and it is preferable that Tg of the component (a) is −50° C. or more. If Tg is −50° C. or more, an adhesive composition has suitable tackiness in a B-stage condition and excellently handled. From such viewpoint, the mixing ratio of a functional group-containing monomer and a monomer other than the functional group-containing monomer (functional group-containing monomer: monomer other than the functional group-containing monomer) is preferably 100:0 to 0.1:99.9, more preferably 100:0 to 1:99, further preferably 50:50 to 1:99, particularly preferably 30:70 to 1:99 and extremely preferably 20:80 to 1:99.

The component (a) may have at least one selected from the group consisting of a structural unit represented by the following general formula (I), a structural unit represented by the following general formula (II) and a structural unit represented by the following general formula (III).

[Chemical Formula 4]

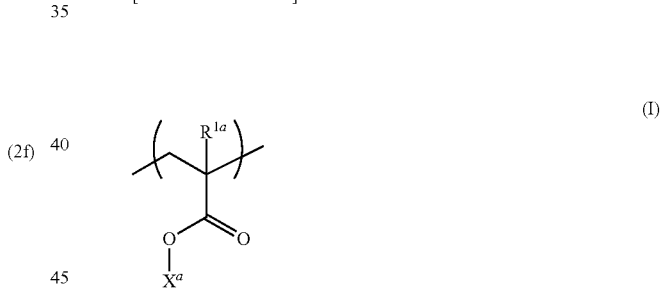

(I)

[In formula (I), $R^{1a}$ a represents a hydrogen atom or a methyl group, and $X^a$ represents an epoxy group-containing group.]

[Chemical Formula 5]

(II)

[In formula (II), $R^{2a}$ represents a hydrogen atom or a methyl group, and $Y^a$ represents an alicyclic group (except the group corresponding to X in formula (I)) having 5 to 22 carbon atoms and optionally having a substituent.]

[Chemical Formula 6]

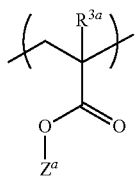

(III)

[In formula (III), $R^{3a}$ represents a hydrogen atom or a methyl group, and $Z^a$ represents a linear or branched alkyl group (except the group corresponding to X in formula (I)) having 1 to 10 carbon atoms and optionally having a substituent.]

In the case where a (meth)acrylic polymer (for example, a (meth)acrylic polymer having a structural unit having a functional group) is produced by polymerizing a monomer, the method for polymerizing thereof is not particularly limited, and solution polymerization, suspension polymerization (pearl polymerization) and the like mentioned above can be used.

It is preferable that the weight average molecular weight of the component (a) falls within the following range from the viewpoint that the resultant film has suitable strength, flexibility and tackiness, and flowability is appropriate, and therefore, a circuit filling property of wiring can be easily ensured. The weight average molecular weight of the component (a) is preferably 100000 or more, more preferably 120000 or more, further preferably 200000 or more, particularly preferably 300000 or more, extremely preferably 400000 or more and very preferably 450000 or more from the viewpoint that a sufficient elastic modulus (for example, elastic modulus at 260° C.) can be maintained. The weight average molecular weight of the component (a) is preferably 3000000 or less, more preferably 2000000 or less, further preferably 1000000 or less and particularly preferably 800000 or less. From these viewpoints, the weight average molecular weight of the component (a) is preferably 100000 or more, more preferably 120000 to 3000000, further preferably 120000 to 2000000, particularly preferably 200000 to 1000000, very preferably 300000 to 1000000 and further more preferably 400000 to 800000 and further preferably 450000 to 800000. Note that, in the embodiment, the weight average molecular weight refers to a value obtained by carrying out measurement by gel permeation chromatography (GPC) and converting the measured value with reference to the standard polystyrene calibration, as described in Examples.

It is preferable that the content of the component (a) relative to the total of 100 parts by mass of the component (b) is falls within the following range from the viewpoint that a satisfactory storage modulus is obtained, flow during molding can be suppressed, and satisfactory handling at a high temperature can be provided. The content of the component (a) is preferably 10 parts by mass or more, more preferably 15 parts by mass or more, further preferably 20 parts by mass or more, particularly preferably 50 parts by mass or more, extremely preferably 75 parts by mass or more and very preferably 100 parts by mass or more. The content of the component (a) is preferably 400 parts by mass or less, more preferably 350 parts by mass or less, further preferably 300 parts by mass or less, particularly preferably 200 parts by mass or less and extremely preferably 150 parts by mass or less. From these viewpoints, the content of the component (a) is preferably 10 to 400 parts by mass, more preferably 15 to 350 parts by mass, further preferably 20 to 300 parts by mass, particularly preferably 50 to 200 parts by mass, extremely preferably 75 to 150 parts by mass and very preferably 100 to 150 parts by mass.

((b) Compound Having at Least Two (Meth)Acryloyl Groups)

Examples of the compound having at least two (meth)acryloyl groups include a (meth)acrylic monomer and oligomers thereof (except for the compound corresponding to the component (a)). The molecular weight (for example, weight average molecular weight) of the component (b) may be, for example, 20000 or less, and 10000 or less.

Examples of the monomer having at least two (meth)acryloyl groups include, but are not particularly limited to, a multifunctional (meth)acrylic monomer having an alicyclic structure, a multifunctional (meth)acrylic monomer having an aliphatic structure, a multifunctional (meth)acrylic monomer having a dioxane glycol structure, and a multifunctional (meth)acrylic monomer having a functional group (except a (meth)acryloyl group). The multifunctional (meth)acrylic monomers having an alicyclic structure, an aliphatic structure or a dioxane glycol structure is excluded from the multifunctional (meth)acrylic monomer having a functional group. Note that, "multifunctional" herein is used for expressing a (meth)acryloyl group and means that at least two (meth)acryloyl groups are present in a compound.

The component (b) can be used alone or in combination of two or more.

It is preferable that the component (b) is at least one selected from the group consisting of a multifunctional (meth)acrylic monomer having an alicyclic structure and a multifunctional (meth)acrylic monomer having a dioxane glycol structure from the viewpoint that transparency of a cured article is further improved. It is preferable that the component (b) is a multifunctional (meth)acrylic monomer having an aliphatic structure from the viewpoint that crack of a cured article and detachment from a base material are easily prevented.

Examples of the multifunctional (meth)acrylic monomer include a (meth)acrylic monomer having two (meth)acryloyl groups.

Examples of (meth)acrylic monomer having two (meth)acryloyl groups include cyclohexane-1,4-dimethanol di(meth)acrylate, cyclohexane-1,3-dimethanol di(meth)acrylate, tricyclodecanedimethylol di(meth)acrylate (for example, KAYARAD R-684, tricyclodecanedimethylol diacrylate, Nippon Kayaku Co., Ltd.), tricyclodecanedimethanol di(meth)acrylate (for example, A-DCP, tricyclodecanedimethanol diacrylate, Shin-Nakamura Chemical Co., Ltd.), dioxane glycol di(meth)acrylate (for example, A-DOG, dioxane glycol diacrylate, Shin-Nakamura Chemical Co., Ltd.), nonanediol di(meth)acrylate, neopentyl glycol di(meth)acrylate, dicyclopentanyl di(meth)acrylate, 1,6-hexanediol di(meth)acrylate, ethylene oxide-modified 1,6-hexanediol di(meth)acrylate, neopentyl glycol di(meth)acrylate, (poly)ethylene oxide-modified neopentyl glycol di(meth)acrylate, hydroxypivalic acid neopentyl glycol di(meth)acrylate, polyethylene glycol di(meth)acrylate, polypropylene glycol di(meth)acrylate, ethylene oxide-modified bisphenol A-based di(meth)acrylate (preferably polyethylene oxide-modified bisphenol A-based (meth)acrylate, more preferably ethylene oxide 5 to 15 moles-modified bisphenol A-based di(meth)acrylate) and (poly)ethylene oxide-modified phosphoric acid di(meth)acrylate.

Among them, at least one selected from the group consisting of dioxane glycol di(meth)acrylate and tricyclodecanedimethanol di(meth)acrylate is preferable and at least one selected from the group consisting of dioxane glycol diacrylate and tricyclodecanedimethanol diacrylate is more preferable from the viewpoint that transparency of a cured article is further improved.

Examples of the multifunctional (meth)acrylic monomer other than those mentioned above include (meth)acrylic monomers having three (meth)acryloyl groups, such as pentaerythritol tri(meth)acrylate and ethylene oxide modified isocyanuric acid tri(meth)acrylate.

The content of the component (b) relative to the total of 100 parts by mass of the component (a) and the component (b) is preferably 20 parts by mass or more, more preferably 30 parts by mass or more and further preferably 40 parts by mass or more. The content of the component (b) relative to the total of 100 parts by mass of the component (a) and the component (b) is preferably 80 parts by mass or less, more preferably 70 parts by mass or less, further preferably 60 parts by mass or less and particularly preferably 50 parts by mass or less. The content of the component (b) relative to the total of 100 parts by mass of the component (a) and the component (b) is preferably 20 to 80 parts by mass, more preferably 30 to 70 parts by mass, further preferably 40 to 60 parts by mass and particularly preferably 50 to 60 parts by mass. If the content of the component (b) falls within each of the above-mentioned ranges, three dimensional crosslinkage is easily formed, and therefore, heat-resistance tends to be further improved. Also, even if phase separation occurs after curing, the range of the phase separation is suppressed to micro scale. As a result, variation in property of cured articles, such as visibility and bonding strength, can be easily suppressed and warp or crack of semiconductors or electronic parts in production steps can be easily suppressed.

((c) Polymerization Initiator)

As the polymerization initiator (c), for example, (c1) a thermal polymerization initiator (hereinafter, sometimes referred to as a "component (c1)") and/or (c2) a photopolymerization initiator (hereinafter, sometimes referred to as a "component (c2)") can be used.

Examples of the component (c1) include an organic peroxide and an azo compound as described in International Publication No. WO2015/115537.

The component (c1) can be used alone or in combination of two or more.

Among these components (c1), an organic peroxide is preferable from the viewpoint of a large effect in improving properties of a cured article; and an organic peroxide having a 10-hour half-life temperature of 90 to 150° C. is more preferable from the viewpoint that handling (e.g., shelf life and pot life) is satisfactorily balanced with curability for an adhesive composition. Note that, the half-life temperature of an organic peroxide can be measured by a method described in International Publication No. WO2015/115537.

Among the component (c1) mentioned above, at least one selected from the group consisting of dicumyl peroxide (for example, trade name: PERCUMYL Mill D, manufactured by NOF Corporation) and n-butyl 4,4-bis(t-butylperoxy) valerate (for example, trade name: Perhexa V, manufactured by NOF Corporation) is preferable as the organic peroxides from the viewpoint that storage stability and thermosetting property are excellent.

Note that, if it is used in combination with the component (a) and the component (b), component (c1) can exhibit further excellent heat resistance, peel resistance and stress relaxation, thereby improving reliability of a semiconductor device (e.g., optical parts).

It is preferable that the content of the component (c1) relative to the total of 100 parts by mass of the component (a) and the component (b) falls within the following range from the viewpoint that transparency is further improved and the viewpoint that outgassing is easily suppressed. The content of the component (c1) is preferably 0.1 parts by mass or more, more preferably 0.2 parts by mass or more, further preferably 0.5 parts by mass or more and particularly preferably 1 part by mass or more. The content of the component (c1) is preferably 30 parts by mass or less, more preferably 20 parts by mass or less, further preferably 10 parts by mass or less, particularly preferably 5 parts by mass or less and extremely preferably 3 parts by mass or less. The content of the component (c 1) is preferably 0.1 to 30 parts by mass, more preferably 0.2 to 20 parts by mass, further preferably 0.5 to 10 parts by mass, particularly preferably 0.5 to 5 parts by mass and extremely preferably 1 to 3 parts by mass.

Examples of the component (c2) include an acylphosphine oxide, oxime esters, an aromatic ketone, quinones, a benzoin ether compound, a benzyl derivative, a 2,4,5-triaryl imidazole dimer, an acridine derivative, a coumarin compound, N-phenylglycine and a N-phenylglycine derivative. The component (c2) may be synthesized by a conventional method or a commercially available one may be used.

Among them, at least one selected from the group consisting of an acylphosphine oxide and oxime esters is preferable from the viewpoint that photocuring property is improved, the viewpoint of high sensitivity, and the viewpoint that transparency of a cured article (e.g., cured film) is further excellent.

The component (c2) may be used alone or in combination of two or more.

Examples of the acylphosphine oxide include bis(2,4,6-trimethylbenzoyl)-phenylphosphine oxide (for example, trade name: IRGACURE-819, BASF) and 2,4,6-trimethylbenzoyl-diphenylphosphine oxide (for example, trade name: LUCIRIN TPO, BASF).

Examples of the oxime esters include 1,2-octanedione-1-[4-(phenylthio)phenyl-2-(O-benzoyloxime)] (for example, trade name: IRGACURE-OXE01, BASF), 1-[9-ethyl-6-(2-methylbenzoyl)-9H-carbazol-3-yl]ethanone-1-(O-acetyl oxime) (for example, trade name: IRGACURE-OXE02, BASF) and 1-phenyl-1,2-propanedione-2-[o-(ethoxycarbonyl)oxime] (for example, trade name: Quantacure-PDO, Nippon Kayaku Co., Ltd.).

Examples of the aromatic ketone include compounds described in International Publication No. WO2015/115537.

Examples of the quinones include compounds described in International Publication No. WO2015/115537.

Examples of the benzoin ether compound include benzoin methyl ether, benzoin ethyl ether and benzoin phenyl ether.

Examples of the benzyl derivative include a benzoin compound such as benzoin, methyl benzoin and ethyl benzoin; and benzyl dimethyl ketal.

Examples of the 2,4,5-triaryl imidazole dimer include compounds described in International Publication No. WO2015/115537.

Examples of the acridine derivative include 9-phenyl acridine and 1,7-bis(9,9'-acridinyl)heptane.

Examples of the coumarin compound include compounds described in International Publication No. WO2015/115537.

Examples of the N-phenylglycine derivative include N-phenylglycine butyl ester, N-p-methyl phenylglycine, N-p-methyl phenylglycine methyl ester, N-(2,4-dimethylphenyl) glycine and N-methoxyphenylglycine.

The content of the component (c2) relative to the total of 100 parts by mass of the component (a) and the component (b) is preferably 0.1 to 20 parts by mass, more preferably 0.5 to 10 parts by mass and further preferably 0.75 to 5 parts by mass. If the content of the component (c2) falls within these ranges, foaming, turbidity, coloring and cracking of a cured article can be further highly prevented.

((d) Filler)

Examples of a filler serving as the component (d) include an inorganic filler and an organic filler. As the component (d), an inorganic filler is preferable from the viewpoint that heat-resistance or thermal conductivity is further improved, the viewpoint that melt viscosity is suitably controlled, or the viewpoint that a thixotropic index is further suitably provided. The component (d) may be used alone or in combination of two or more.

Examples of the components contained in the inorganic filler include, but are not particularly limited to, aluminum hydroxide, magnesium hydroxide, calcium carbonate, magnesium carbonate, calcium silicate, magnesium silicate, calcium oxide, magnesium oxide, aluminum oxide, aluminum nitride, titanium oxide, zirconium oxide, cerium oxide, zinc oxide, aluminum borate whisker, boron nitride, silica (e.g., crystalline silica and amorphous silica), antimony oxide and a metal (e.g., silver).

As the component (d), a glass filler can be used. The glass filler contains silica ($SiO_2$) and may contain $ZrO_2$, $B_2O_3$, $Na_2O$, $F_2$, $Al_2O_3$, CaO, MgO, SrO or the like in a predetermined ratio.

As the components contained in the inorganic filler include at least one selected from the group consisting of aluminum oxide, aluminum nitride, boron nitride and silica (silicon oxide. e.g., crystalline silica and amorphous silica) is preferable from the viewpoint that thermal conductivity is further improved. As the component contained in the inorganic filler, at least one selected from the group consisting of aluminum hydroxide, magnesium hydroxide, calcium carbonate, magnesium carbonate, calcium silicate, magnesium silicate, calcium oxide, magnesium oxide, aluminum oxide and silica (e.g., crystalline silica and amorphous silica) is preferable from the viewpoint that melt viscosity is controlled or thixotropic index is further suitably provided. As the component contained in the inorganic filler, at least one selected from the group consisting of zirconium oxide, titanium oxide, silver and glass is preferable from the viewpoint that the refractive index is easily controlled.

As the component contained in the component (d), silica is preferable and amorphous silica is more preferable from the viewpoint that further excellent transparency, refractive index and workability are obtained.

The refractive index of the component (d) is preferably 1.46 to 1.60, more preferably 1.48 to 1.54 and further preferably 1.49 to 1.52 from the viewpoint that transparency is further excellent when the component (a) and the component (b) are used in combination.

The average particle size of the component (d) is preferably 5 nm or more, more preferably 10 nm or more, further preferably 12 nm or more and particularly preferably 15 nm or more from the viewpoint that dispersibility and workability are excellent and the viewpoint that thixotropic index is further excellent. The average particle size of the component (d) is preferably 10000 nm or less, more preferably 5000 nm or less, further preferably 1000 nm or less, particularly preferably 500 nm or less, extremely preferably 300 nm or less, very preferably 100 nm or less and further more preferably 50 nm or less from the viewpoint that transparency is further excellent and the viewpoint that workability in filtering a resin composition (an adhesive composition) is excellent. The average particle size of the component (d) is preferably 5 to 10000 nm, more preferably 10 to 5000 nm, further preferably 10 to 1000 nm, particularly preferably 12 to 500 nm, extremely preferably 12 to 300 nm, very preferably 15 to 100 nm and further more preferably 15 to 50 nm from the viewpoint that thixotropic index can be further suitably provided while maintaining transparency.

The average particle size of the component (d) is the average particle size of a filler dispersed in an adhesive composition and defined as a value obtained by the following measurement. First, an adhesive composition is diluted (or dissolved) in a solvent (e.g., methyl ethyl ketone) to 1000-fold (volume ratio). Thereafter, particles dispersed in the adhesive composition are measured by using a submicron particle analyzer (trade name: N5, manufactured by Beckman Coulter, Inc.) in accordance with international standard ISO13321, at a refractive index of 1.38, and the particle size at an integrated value of 50% (volume standard) in the particle size distribution is defined as the average particle size. The particle size at an integrated value of 99.9% (volume standard) in the particle size distribution is defined as a maximum particle size. Note that, with respect to a filler in the adhesive resin layer (uncured) or the cured film of an adhesive composition disposed on a supporting base material, measurement can be made by diluting (or dissolving) the adhesive composition with a solvent to 1000-fold (volume ratio) and then using the submicron particle analyzer, as described above.

It is preferable that the content of the component (d) relative to the total of 100 parts by mass of the component (a) and the component (b) falls within the following range from the viewpoint that excellent transparency, refractive index and workability are obtained. The content of the component (d) is preferably 0.1 parts by mass or more, more preferably 0.2 parts by mass or more, further preferably 0.3 parts by mass or more, particularly preferably 0.5 parts by mass or more, extremely preferably 1 part by mass or more, very preferably 2 parts by mass or more, further more preferably 5 parts by mass or more, further preferably 7.5 parts by mass or more and particularly preferably 10 parts by mass or more. The content of the component (d) is preferably 40 parts by mass or less, more preferably 30 parts by mass or less and further preferably 20 parts by mass or less. From these viewpoints, the content of the component (d) is preferably 0.1 to 40 parts by mass, more preferably 0.2 to 30 parts by mass, further preferably 0.3 to 20 parts by mass, particularly preferably 0.5 to 20 parts by mass, extremely preferably 1 to 20 parts by mass, very preferably 2 to 20 parts by mass, further more preferably 5 to 20 parts by mass, further preferably 7.5 to 20 parts by mass and particularly preferably 10 to 20 parts by mass. It is preferable that the content of $SiO_2$ in the component (d) based on the total amount of the component (d) is 50 to 100 mass % from the viewpoint that transparency is further improved. Note that, the "content of $SiO_2$" herein refers to the content of $SiO_2$ based on the total amount of filler component.

((e) Antioxidant)

The adhesive composition of the embodiment can comprise an antioxidant if necessary. Examples of the antioxidant include a phenolic antioxidant, a thioether antioxidant and a thiol antioxidant. The antioxidant can be used alone or in combination of two or more.

Examples of the phenolic antioxidant includes a hindered phenolic compound. Examples of the hindered phenolic compound include compounds described in International Publication No. WO2015/046422, specifically, bis[3-(3-tert-butyl-4-hydroxy-5-methylphenyl)propionic acid] (2,4,8,10-tetraoxaspiro[5.5]undecane-3,9-diyl) bis(2,2-dimethyl-2,1-ethanediyl).

Examples of the thioether antioxidant include ditridecyl 3,3-thiobispropionate (for example, "Adekastab AO-503" (ADEKA CORP.)). Examples of the thiol antioxidant include a compound having a thiol group. Examples of the compound having a thiol group include 1,3,5-tris(3-mercaptobutyryloxyethyl)-1,3,5-triazine-2,4,6(1H,3H,5H)-trione (for example, "KarenzMT-NR1" (KYOEISHA CHEMICAL Co., Ltd.)).

It is preferable that the content of the antioxidant relative to the total of 100 parts by mass of the component (a), the component (b) and the component (c) falls within the following range from the viewpoint that transmissivity is further improved and the viewpoint that a negative effect on radical polymerization reactivity is rarely produced. The content of the antioxidant is preferably 0.01 parts by mass or more, more preferably 0.1 parts by mass or more, further preferably 1 part by mass or more and particularly preferably 2 parts by mass or more. The content of the antioxidant is preferably 10 parts by mass or less, more preferably 8 parts by mass or less, further preferably 5 parts by mass or less and particularly preferably 4 parts by mass or less. From these viewpoints, the content of the antioxidant is preferably 0.01 to 10 parts by mass, more preferably 0.1 to 8 parts by mass, further preferably 1 to 5 parts by mass, and particularly preferably 2 to 4 parts by mass.

(Coupling Agent)

The adhesive composition of the embodiment can comprise a coupling agent. Examples of the coupling agent include, but are not particularly limited to, a silane coupling agent, a titanate coupling agent, an aluminum coupling agent, a zirconate coupling agent and a zircoaluminate coupling agent. The coupling agent can be used alone or in combination of two or more.

The silane coupling agent may be an alkoxysilane. The silane coupling agent may be an alkoxysilane having at least one functional group selected from the group consisting of a vinyl group, an epoxy group, a styryl group, a (meth)acrylic group, an amino group, an isocyanurate group, a ureido group, a mercapto group and an isocyanate group. Specific examples of the silane coupling agent include compounds described in International Publication No. WO2015/115537.

Examples of the titanate coupling agent include compounds described in International Publication No. WO2015/115537.

Examples of the aluminum coupling agent include acetoalkoxyaluminum diisopropionate.

Examples of the zirconate coupling agent include tetrapropyl zirconate, tetrabutyl zirconate, tetra(triethanolamine) zirconate, tetraisopropyl zirconate, zirconium acetylacetonate, acetyl acetone zirconium butyrate and zirconium stearate butyrate.

Examples of the zircoaluminate coupling agent include the compounds represented by the following general formula (3).

[Chemical Formula 7]

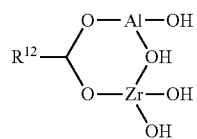

(3)

[In formula (3), $R^{12}$ represents a carboxyl group or an amino group.]

Examples of the compound where $R^{12}$ is a carboxyl group include Manchem CPG-carboxyzircoaluminate. Examples of the compound where $R^{12}$ is an amino group include a Manchem APO-X-amino zircoaluminate solution. Both can be obtained from Rhone-Poulenc.

Among these coupling agents, from the viewpoint that it is highly effective in improving binding or wettability of materials at the interface, a silane coupling agent is preferable. a silane coupling agent having a (meth)acrylic group is more preferable, and at least one selected from the group consisting of γ-methacryloxypropyltrimethoxysilane (alias: methacrylic acid 3-(trimethoxysilyl)propyl), γ-methacryloxypropyl methyl dimethoxysilane and γ-acryloxypropyltrimethoxysilane is further preferable.

It is preferable that the content of the coupling agent relative to the total of 100 parts by mass of the component (a), the component (b) and the component (c) falls within the following range. The content of the coupling agent is preferably 0.1 parts by mass or more, more preferably 0.5 parts by mass or more and further preferably 0.8 parts by mass or more from the viewpoint that an effect of improving adhesion strength tends to be easily obtained. The content of the coupling agent is preferably 20 parts by mass or less, more preferably 15 parts by mass or less, further preferably 10 parts by mass or less, particularly preferably 5 parts by mass or less, extremely preferably 3 parts by mass or less and very preferably 1 part by mass or less from the viewpoint that a volatile content is low and generation of voids in a cured article tends to be easily suppressed. From these viewpoints, the content of the coupling agent is preferably 0.1 to 20 parts by mass, more preferably 0.5 to 15 parts by mass, further preferably 0.8 to 10 parts by mass, particularly preferably 0.8 to 5 parts by mass, extremely preferably 0.8 to 3 parts by mass and very preferably 0.8 to 1 part by mass.

(Epoxy Curing Agent)

The adhesive composition of the embodiment may comprise an epoxy curing agent. The epoxy curing agent can be used together with a compound having an epoxy group. The epoxy curing agent is not particularly limited as long as it is a compound reactive with a compound having an epoxy group. It is preferable that the molecular weight of the epoxy curing agent is 100 to 400 degree. It is preferable that the epoxy curing agent is colorless or relatively not colored (for example, light yellow). Examples of the epoxy curing agent include an acid anhydride curing agent, an isocyanuric acid derivative and a phenolic curing agent. The epoxy curing agent can be used alone or in combination of two or more.

Examples of the acid anhydride curing agent include phthalic anhydride, maleic anhydride, trimellitic anhydride, pyromellitic anhydride, hexahydrophthalic anhydride, tetrahydrophthalic anhydride, methyl nadic anhydride, nadic anhydride, glutaric anhydride, dimethyl glutaric anhydride, diethyl glutaric anhydride, succinic anhydride, methyl hexahydrophthalic anhydride, methyl tetrahydrophthalic anhydride and derivatives thereof. Examples of the acid anhydride curing agent (phthalic anhydride derivative) include 3 or 4-methyl-1,2,3,6-tetrahydrophthalic anhydride, 3 or 4-methyl-hexahydrophthalic anhydride and methyl-3, 6-endomethylene-1,2,3,6-tetrahydrophthalic anhydride.

Examples of the isocyanuric acid derivative include 1,3, 5-tris(1-carboxymethyl) isocyanurate, 1,3,5-tris(2-carboxyethyl) isocyanurate, 1,3,5-tris(3-carboxypropyl) isocyanurate and 1,3-bis(2-carboxyethyl) isocyanurate.

Examples of the phenolic curing agent include a novolak-type phenolic resin obtained by condensation or co-condensation of phenols and/or naphthols with a compound having an aldehyde group (e.g., formaldehyde, benzaldehyde and salicylaldehyde) in the presence of an acidic catalyst; a phenol/aralkyl resin synthesized from phenols and/or naphthols with dimethoxy paraxylene or bis(methoxy methyl) biphenyl; an aralkyl-type phenolic resin such as a biphenylene-type phenol/aralkyl resin and a naphthol/aralkyl resin; a dicyclopentadiene-type phenolic resin (e.g., dicyclopentadiene-type phenolic novolak resin and a dicyclopentadiene naphthol novolak resin) synthesized by copolymerization of phenols and/or naphthols with a dicyclopentadiene; a triphenylmethane-type phenolic resin; a terpene-modified phenolic resin; a paraxylylene and/or metaxylylene-modified phenolic resin; a melamine-modified phenolic resin; a cyclopentadiene-modified phenolic resin; and a phenol resin obtained by copolymerization of two types or more monomers providing the aforementioned resins. Examples of the phenols include phenol, cresol, resorcin, catechol, bisphenol A, bisphenol F, phenylphenol and aminophenol. Examples of the naphthols include α-naphthol, β-naphthol and dihydroxynaphthalene.

Among the epoxy curing agents, a phthalic anhydride type epoxy curing agent (for example, 3 or 4-methylhexahydrophthalic anhydride (trade name: HN-5500 (Hitachi Chemical Co., Ltd.))) is preferable from the viewpoint that it is a liquid curing agent, and therefore, it is easy to mix with a compound having an epoxy group, the viewpoint that low toxic compared to an amine curing agent, the viewpoint that a mixture has a long and stable pot life, and the viewpoint that a colorless transparent cured article excellent in weather/heat-resistant can be easily obtained.

As the content ratio of a compound having an epoxy group and an epoxy curing agent, relative to 1 equivalent of an epoxy group in the compound having an epoxy group, the ratio of an active group (e.g., an acid anhydride group and a hydroxyl group) in the epoxy curing agent reactive to the epoxy group is preferably 0.4 to 1.6 equivalents and more preferably 0.5 to 1.5 equivalents. If the ratio of the active group is 0.4 equivalents or more, the cure rate of an adhesive composition is sufficiently high; at the same time, a cured article having a sufficiently high glass-transition temperature and a satisfactory elastic modulus is obtained. If the ratio of the active group is 1.6 equivalents or less, the strength of a cured article is sufficiently high.

(Epoxy Curing Accelerator)

The adhesive composition of the embodiment may comprise an epoxy curing accelerator if necessary. Examples of the epoxy curing accelerator that can be used include a tertiary amine such as 1,8-diaza-bicyclo(5,4,0)undecene-7, triethylenediamine and tri-2,4,6-dimethylaminomethylphenol; an imidazole such as 2-ethyl-4-methylimidazole and 2-methylimidazole; a phosphorus compound such as triphenylphosphine, tetraphenylphosphonium tetraphenylborate, tetra-n-butylphosphonium-o,o-diethylphosphorodithioate, tetra-n-butylphosphonium-tetrafluoroborate, tetra-n-butylphosphonium-tetraphenylborate and methyl-tributylphosphonium dimethylphosphate; a quaternary ammonium salt; an organometallic salt; and derivatives of these. Among them, a phosphorus compound is preferable from the viewpoint that the adhesive composition has excellent stability, transparency and ease of mixing. The epoxy curing accelerator can be used alone or in combination of two or more.

It is preferable that the content of the epoxy curing accelerator based on the total amount of the epoxy curing agent falls within the following range. The content of the epoxy curing accelerator is preferably 0.01 mass % or more, more preferably 0.1 mass % or more and further preferably 1.0 mass % or more from the viewpoint of easily obtaining a sufficient accelerating effect. The content of the epoxy curing accelerator is preferably 8.0 mass % or less, more preferably 3.0 mass % or less and further preferably 2.0 mass % or less from the viewpoint of easily suppressing change in color of a cured article to be obtained. From these viewpoints, the content of the epoxy curing accelerator is preferably 0.01 to 8.0 mass %, more preferably 0.1 to 3.0 mass % and further preferably 1.0 to 2.0 mass %.

(Organic Solvent)

The adhesive composition of the embodiment can comprise an organic solvent if necessary. Owing to this, components can be dissolved or dispersed in the organic solvent to obtain a varnish-like adhesive composition. The varnish-like adhesive composition is improved in coating properties to a base material and satisfactory in workability.

As the organic solvent, it is not limited as long as components contained in an adhesive composition can be uniformly mixed with stirring, dissolved, kneaded or dispersed in the solvent, and a solvent known in the art can be used. Examples of the organic solvent include, but are not particularly limited to, an alcohol-, an ether-, ketone-, an amide-, an aromatic hydrocarbon-, an ester and a nitrile-based solvent. Specifically, examples include a low boiling point solvent (e.g., diethyl ether, acetone, methanol, tetrahydrofuran, hexane, ethyl acetate, ethanol, methyl ethyl ketone and 2-propanol) from the viewpoint of easily suppressing evaporation at a low temperature; a high boiling point solvent (e.g., toluene, methyl isobutyl ketone, 1-butanol, 2-methoxyethanol, 2-ethoxyethanol, xylene, N,N-dimethyl acetamide, N,N-dimethyl formamide, cyclohexanone, dimethylacetamide, butylcellosolve, dimethylsulfoxide, propylene glycol monomethyl ether acetate, N-methyl-2-pyrrolidone and γ-butyrolactone) from the viewpoint of improving coating-film stability and the like. The organic solvent can be used alone or in combination of two or more.

Among them, at least one selected from the group consisting of methyl ethyl ketone, cyclohexanone and propylene glycol monomethyl ether acetate is preferable from the viewpoint of excellent solubility and high drying rate.

The content of the organic solvent is determined based on viscosity of a varnish-like composition and the like. The content of the organic solvent, although it is not particularly limited, is preferably 5 to 95 mass % and more preferably 10 to 90 mass % based on the total amount of the adhesive composition.

(Other Components)

The adhesive composition of the embodiment may comprise a monofunctional (meth)acrylic monomer (a compound having a single (meth)acryloyl group) other than the component (b). Examples of the monofunctional (meth) acrylic monomer include (meth)acrylic monomers (e.g., glycidyl (meth)acrylate) mentioned as examples of the component (a). The monofunctional (meth)acrylic monomer can be used alone or in combination of two or more.

The adhesive composition of the embodiment can comprise, if necessary, a wetting improver such as a fluorine-based surfactant, a nonionic surfactant and a higher fatty acid; an antifoaming agent such as silicone oil; an ion trapping agent such as an inorganic ion exchanger; and a refractive index modifier or a light absorbing agent (UV absorbent, IR absorbent and the like). These can be used alone or in combination of two or more.

(Thixotropic Index (Viscosity))

Thixotropic index (also referred to as "thixotropic degree") of the adhesive composition of the embodiment is preferably 1.3 or more and more preferably 1.4 or more from the viewpoint that stringing rarely occurs and a liquid is easily discharged, and therefore, handling is improved. The upper limit of the thixotropic index is preferably 5.0 or less and more preferably 4.0 or less. For example, the viscosity (T.I) of the adhesive composition of the embodiment is obtained by measuring viscosity (25° C.) at a low-speed rotation and viscosity (25° C.) at a high-speed rotation with the conditions shown below and calculating in accordance with the following formula:

$$T.I=V2/V1$$

V1: Viscosity (P) at high-speed rotation
V2: Viscosity (P) at low-speed rotation
For example, conditions are as follows.
(1) Viscometer: EHD type viscometer (Toki Sangyo Co., Ltd.)
(2) Corn: 3° corn
(3) High-speed rotation: 5.0 rpm/3 min
(4) Low-speed rotation: 0.5 rpm/3 min
(Preparation of Adhesive Composition)

The adhesive composition of the embodiment can be obtained by mixing individual components mentioned above. In the case of using a varnish-like adhesive composition containing a filler, in consideration of dispersibility of the filler, it is preferably used after physical shearing force is provided by a grinder, three rolls, ball mill, bead mill or the like to sufficiently disperse such that secondary aggregated particles are not present. The dispersion methods mentioned above may be used in combination of two or more.

By mixing a filler and a small molecular weight substances beforehand, and then, blending a high molecular weight substance, mixing time can be shortened.

Examples of a method for uniformly mixing and stirring individual components include, but are not particularly limited to, methods using a rotation/revolution stirrer such as a dissolver, a static mixer, a homogenizer, an ultrasonic homogenizer, a paint shaker, a ball mill, a planetary mixer, a mix rotor and a universal stirrer; and a kneading apparatus such as a grinder and three rolls. These methods can be appropriately used in combination of two or more. If a varnish-like adhesive composition is used, it is preferable to remove bubbles from a varnish. From these viewpoints, a rotation/revolution stirrer can be suitably used because mixing/dissolving and removal of bubbles can be simultaneously carried out.

<Method for Producing a Semiconductor Device>

The method for producing a semiconductor device of the embodiment has a step of curing an adhesive layer containing the adhesive composition of the embodiment in a state that the adhesive layer is disposed between a semiconductor substrate and a transparent base material. The method for producing a semiconductor device of the embodiment has, for example, a step of forming an adhesive layer (adhesive resin layer) containing the adhesive composition of the embodiment on a semiconductor substrate (adhesive layer formation step) and a step of curing the adhesive layer in a state that the adhesive layer is disposed between the semiconductor substrate and the transparent base material (cured article formation step). For example, the adhesive layer is composed of the adhesive composition of the embodiment. For example, the transparent base material (e.g., glass base material) is a transparent substrate (e.g., glass substrate). The cured article formation step may have a step of sandwiching the adhesive layer between a semiconductor substrate and a transparent base material, and then pressure-bonding the semiconductor substrate and the transparent base material (pressure-bonding step) and a step of curing the adhesive layer (curing step). The pressure-bonding step and curing step are not necessarily independent steps, and curing can be carried out simultaneously with pressure bonding.

Figure 2:
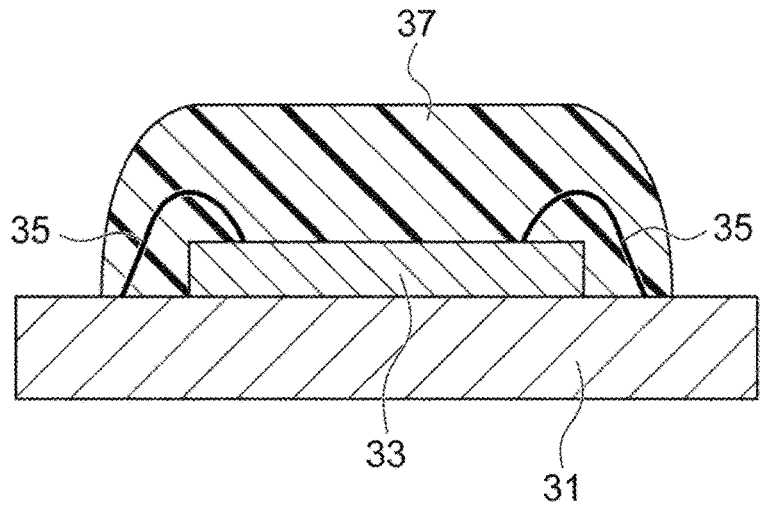
FIG. 2 is a process drawing showing an example of a method for producing a semiconductor device.
Figure 2:
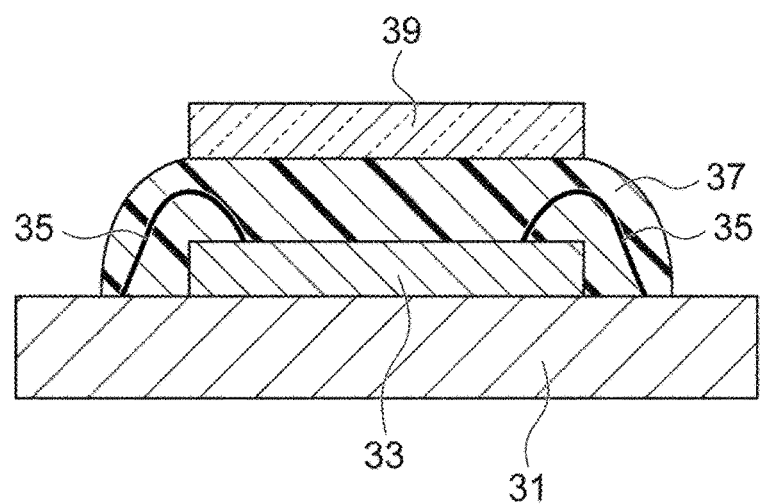
Figure 2:
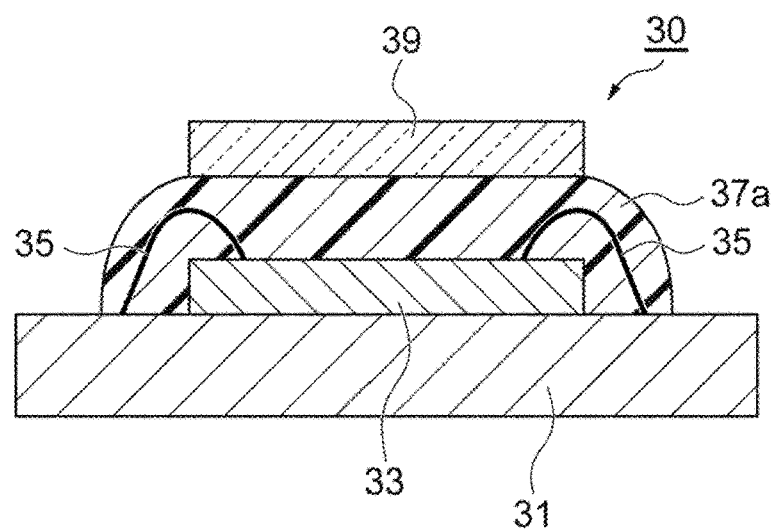

FIG. 1 and FIG. 2 are process drawings showing an example of a method for producing a semiconductor device (optical parts) of the embodiment, and these are process drawings exemplifing a production method using a dispense method. Since the adhesive composition of the embodiment has thixotropic index, coating operation is not affected by dripping or stringiness even if a dispense method is employed and can be carried out while keeping a shape.

First, as shown in FIG. 1(a), a laminate having a support base material 31 and a semiconductor substrate 33 mounted on the support base material 31 is prepared. The terminals (not shown) of the support base material 31 and the semiconductor substrate 33 have been electrically connected to each other via wire 35. If the semiconductor device is a solid-state imaging device, for example, a light receiving section is disposed above the semiconductor substrate 33. Subsequently, as shown in FIG. 1(b), an adhesive composition is supplied onto the semiconductor substrate 33 by a dispense method, and then, as shown in FIG. 2(a), heating is performed for drying to form an adhesive layer 37 on the semiconductor substrate 33. For example, the adhesive layer 37 is formed so as to cover the light receiving section of the semiconductor substrate 33. Subsequently, as shown in FIG. 2 (b), a transparent base material 39 is pressure-bonded on the adhesive layer 37. Then, as shown in FIG. 2(c), the adhesive layer 37 is cured to form an adhesive layer (a cured article) 37a to obtain a semiconductor device 30.

Now, individual steps will be further described below.
(Adhesive Layer Formation Step)

In the adhesive layer formation step, for example, a method for applying the adhesive composition of the embodiment onto a semiconductor substrate or a method for attaching a film-like adhesive composition to a semiconductor substrate can be employed. The semiconductor substrate may be either a semiconductor wafer or a semiconductor element (semiconductor chip).

Examples of the method for applying an adhesive composition include a dispense method (e.g., syringe dispensing method), a spin coating method, a die coat method and a knife coat method. The spin coating method or die coat method, which is suitable for applying a composition containing a high molecular weight compound, is preferable; however, as mentioned above, according to the adhesive composition of the embodiment, coating operation is not affected by dripping or stringiness even if a dispense method is employed and can be carried out while keeping a shape.

If a method for attaching a film-like adhesive composition is employed, it is preferable that laminating is carried out within the range of 0 to 90° C. in order to ensure sufficient spreading in a wet condition. In order to uniformly attach the film, it is preferable to employ roll laminating.

A method for producing a film-like adhesive composition will be described below. The film-like adhesive composition is formed, for example, by uniformly applying the adhesive composition of the embodiment onto a support film and heating the composition in conditions (for example, at a temperature 60 to 200° C. for 0.1 to 30 minutes) under which the solvent used is sufficiently evaporated. At this time, the volume of the solvent, viscosity, the thickness of the initial application (if a die coater, a comma coater or the like is used, the gap between the coater and the support film is controlled) of the adhesive composition, drying temperature, the amount of air and the like are controlled so as to obtain a desired thickness of the film-like adhesive composition.

It is preferable that the support film is flat. Since a support film such as a PET film has high electrostatic adhesion, there is a case where a smoothing agent is used in order to improve workability. Depending upon the type of a smoothing agent and temperature, subtle roughness is transferred to an adhesive and a degree of flatness sometimes reduces. Accordingly, it is preferable to use a support film using no smoothing agent or a support film using a little amount of smoothing agent. From the viewpoint of excellent flexibility, a support film such as a polyethylene film is preferable; however, it is preferable that the thickness and density of a support film are appropriately selected such that a rolling mark or the like is not transferred to the surface of an adhesive layer at the time of lamination.

(Pressure-Bonding Step)

Subsequently, if necessary, the adhesive layer formed on a semiconductor substrate is dried by heating. The drying temperature is not particularly limited; however, in the case where components are dissolved or dispersed in a solvent to use a varnish-like adhesive composition, it is preferable that the drying temperature is lower by 10 to 50° C. than the boiling point of the solvent used from the viewpoint that generation of air bubbles due to bubbling of the solvent is easily suppressed during drying. From the same viewpoint, the drying temperature is more preferably lower by 15 to 45° C. than the boiling point of the solvent used and further preferably lower by 20 to 40° C. than the boiling point of the solvent used.

Particularly, in the case where components are dissolved or dispersed in a solvent to use a varnish-like adhesive composition, it is preferable that the residual amount of solvent is reduced as low as possible from the viewpoint that generation of air bubbles due to bubbling of the solvent is easily suppressed after curing.

Conditions for heat drying are not particularly limited as long as the solvent used is sufficiently evaporated and substantially no radicals are generated from the component (c); however, heating is usually performed at 40 to 100° C. for 0.1 to 90 minutes. Note that, the phrase "substantially no radicals are generated" means that no radicals are generated or, even if radicals are generated, the number of radicals is extremely low, and then, it means the condition that a polymerization reaction does not proceed or, even if the reaction proceeds, the properties of the adhesive layer are not affected. From the viewpoint of reducing the residual amount of solvent while suppressing generation of radicals from the component (c) by heating, it is preferable that a drying is carried out under reduced pressure condition.

From the viewpoint of easily suppressing detachment of the adhesive layer due to bubbling at the time of thermal curing of the adhesive layer during a solder reflow process, it is preferable that volatile components (e.g., residual solvent, low molecular-weight impurities, reaction products, decomposition products, moisture derived from materials, and surface adsorbed water) present inside the adhesive layer or at the surface are sufficiently reduced.

After heat-drying, a transparent base material is pressure-bonded onto the adhesive layer. Note that, the heat-drying can be skipped when a method for attaching a film-like adhesive composition is employed in the adhesive layer formation step.

(Curing Step)

After a semiconductor substrate and a transparent base material are pressure-bonded via an adhesive layer, the adhesive layer is cured to form a cured article. Examples of the curing method include a method for curing with heat and/or light; particularly, curing with heat is preferable.

In the curing step for forming a cured article of the adhesive layer, it is preferable that thermal curing is carried out for 1 to 2 hours while increasing temperature stepwise to the temperature selected. It is preferable that the thermal curing is performed at 100 to 200° C.

<Properties of Cured Article of Adhesive Layer>

The glass-transition temperature (Tg) of the cured article of adhesive layer of the embodiment is preferably −10° C. or more and more preferably 0° C. or more.

The elastic modulus of the cured article of adhesive layer of the embodiment at 25° C. is preferably 0.01 GPa or more, more preferably 0.1 GPa or more and further preferably 0.5 GPa or more. Note that, the upper limit of the elastic modulus at 25° C., which is not particularly limited; is preferably 10 GPa or less from the viewpoint of practicality.

The refractive index of the cured article of adhesive layer of the embodiment at 25° C. is preferably 1.48 to 1.52 and more preferably 1.48 to 1.50.

<Semiconductor Device>

The semiconductor device of the embodiment has a semiconductor substrate, an adhesive layer disposed on the semiconductor substrate, and a transparent base material bonded to the semiconductor substrate via the adhesive layer. The adhesive layer contains the adhesive composition of the embodiment or a cured article thereof. For example, the transparent base material is disposed on the semiconductor substrate via the adhesive layer. Examples of the semiconductor device include optical parts. Examples of the optical parts include optical devices such as a solid-state imaging device. Examples of the solid-state imaging device include a CCD image sensor and a CMOS image sensor. The solid-state imaging device has, for example, a semiconductor substrate having a light receiving section disposed on the upper surface thereof, an adhesive layer disposed on the semiconductor substrate so as to cover the light receiving section, and a transparent base material bonded to the semiconductor substrate via the adhesive layer.

The semiconductor device of the embodiment has, for example, a non-cavity structure using the adhesive composition of the embodiment. Now, a CMOS image sensor, which is a backside illumination type solid-state imaging device, will be described as an example of the semiconductor device of the embodiment, with reference to the accompanying drawings.

Figure 3:
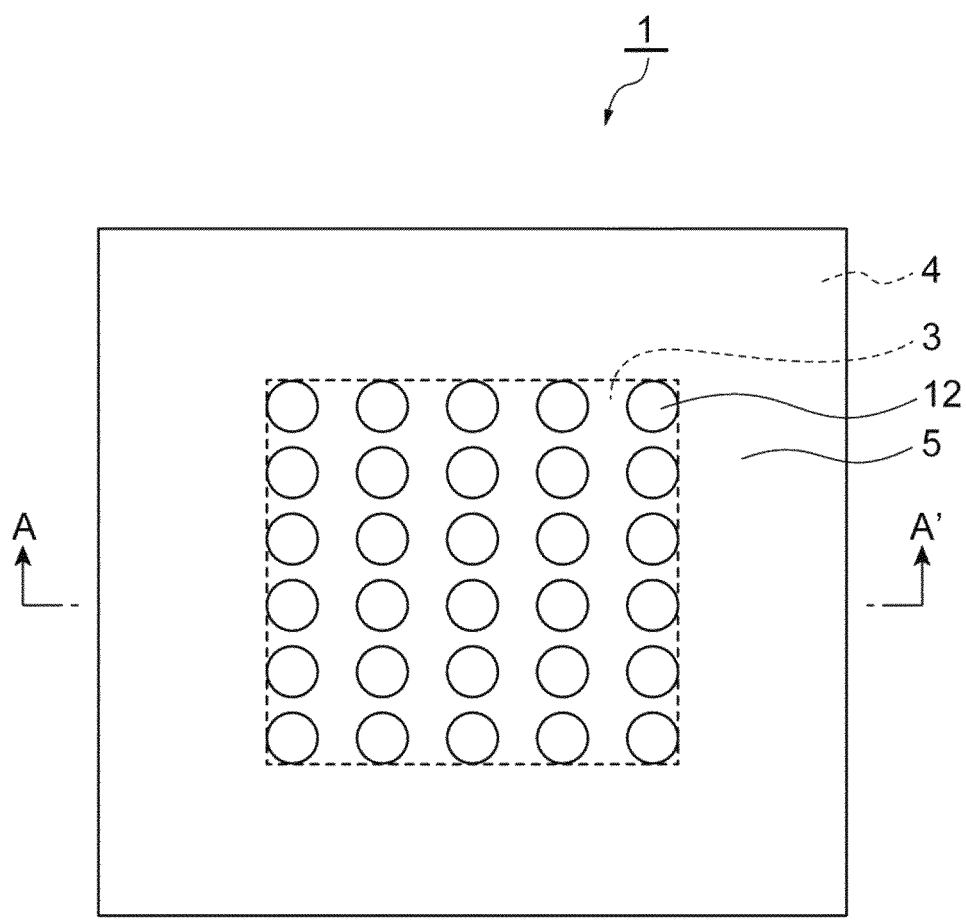
FIG. 3 is a plan view showing an example of a semiconductor device.

FIG. 3 is a plan view showing an example of a semiconductor device (first embodiment, CMOS image sensor). As shown in FIG. 3, a CMOS image sensor 1 has a sensor section (light receiving section) 3 in which a plurality of microlenses 12 are disposed at the center. Around the sensor section 3, a peripheral circuit section 4, in which a circuit is formed, is present. A glass substrate 5 is disposed so as to cover at least the sensor section 3.

Figure 4:
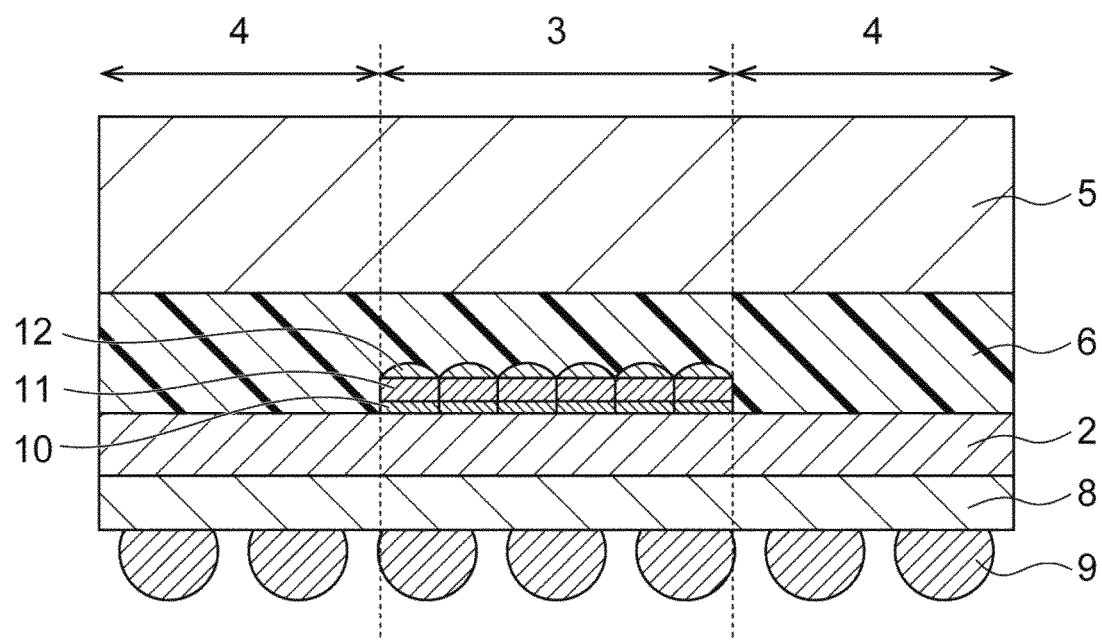
FIG. 4 is a sectional view taken along the line A-A' shown in FIG. 3.

FIG. 4 is a sectional view taken along the line A-A' shown in FIG. 3. As shown in FIG. 4, on one of the surface of a silicon substrate 2, a plurality of photodiodes 10 are disposed. Color filters 11 are disposed on the upper surface of the photodiodes 10 so as to cover at least the photodiodes 10, and the microlenses 12 are disposed on the upper surface of the color filters 11. The color filters 11 are disposed on each of the photodiodes 10, and each of the microlenses 12 are disposed at the position corresponding to each of the color filters 11. An adhesive layer 6 containing the adhesive composition of the embodiment or a cured article thereof is formed over the whole region at one surface side of the silicon substrate 2, in which the microlenses 12 are disposed; and the glass substrate 5 is disposed on the adhesive layer 6. Owing to this, the CMOS image sensor 1 has a structure having no cavity (a non-cavity structure). A wiring layer 8 is disposed at the other surface side of the silicon substrate 2; solder balls 9 are disposed on the lower surface of the wiring layer 8.

Figure 5:
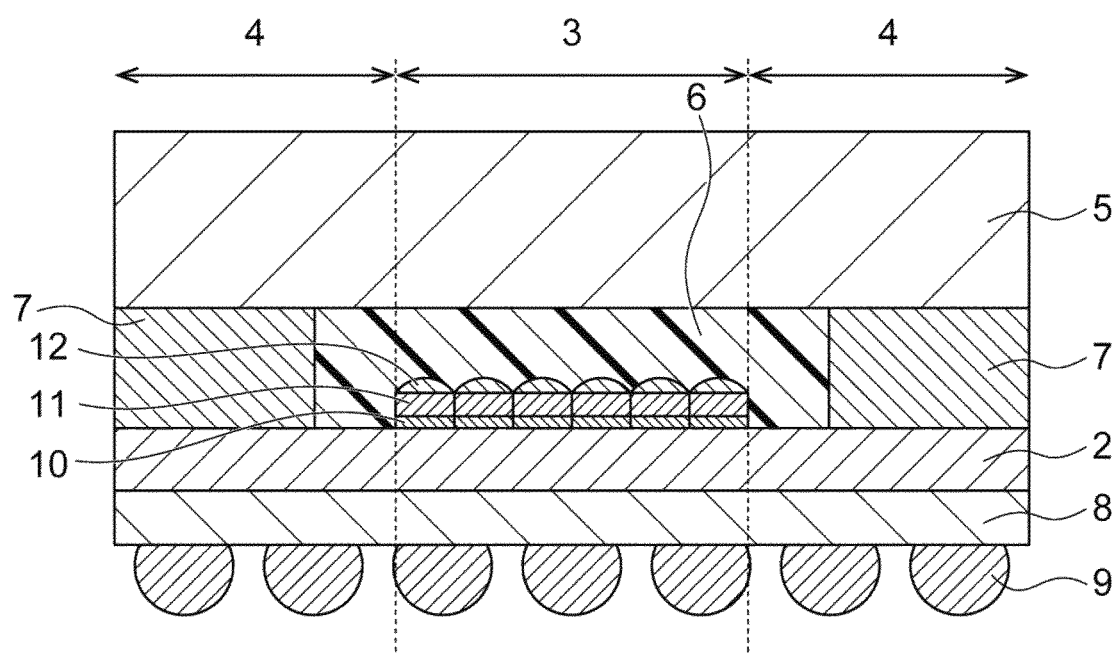
FIG. 5 is a sectional view showing another example of a semiconductor device.

FIG. 5 is a sectional view showing another example of the semiconductor device (second embodiment, CMOS image sensor). In FIG. 5, a frame-like adhesive layer 7 is disposed on the outer peripheral portion of the microlenses 12 so as not to cover the microlenses 12 disposed on the silicon substrate 2, and the transparent glass substrate 5 is disposed on the upper surface of the frame-like adhesive layer 7. The portion surrounded by the silicon substrate 2, the frame-like adhesive layer 7 and the glass substrate 5 is filled with the adhesive layer 6 containing the adhesive composition of the embodiment or a cured article thereof to form a non-cavity structure. In the semiconductor device of FIG. 5, the adhesive layer 6 plays a role not only as an adhesive for bonding the silicon substrate 2 and the glass substrate 5 but also as a sealing material for sealing the microlenses 12, color filter 11 and photodiodes 10 by filling the cavity.

In a conventional non-cavity structure, after an adhesive rib (hereinafter, simply referred to also as "rib") is formed so as to surround a light receiving section, a transparent sealing material is filled so as to seal the light receiving section for bonding a transparent substrate (for example, a glass substrate). In the non-cavity structure of FIG. 5, after the adhesive rib (the frame-like adhesive layer 7) is formed, the cavity is filled with an adhesive composition to form the adhesive layer 6. In the non-cavity structure thus produced, sufficient adhesiveness can be provided for the portion other than the rib, and thus a more highly reliable non-cavity structure can be obtained. In contrast, in the non-cavity structure of FIG. 4, without forming a rib, the silicon substrate 2 and the glass substrate 5 are bonded via the adhesive layer 6 containing the adhesive composition of the embodiment or a cured article thereof. This is because the adhesive composition of the embodiment and a cured article thereof can serve as an adhesive and a sealing material. In this case, in the non-cavity structure (first embodiment) shown in FIG. 4, formation of a rib is not required, compared to the non-cavity structure (second embodiment) shown in FIG. 5, and thus a semiconductor device can be simply produced. In addition, facilities such as a printer, an exposure machine and a developing machine required for forming a rib are not required.

Figure 6:
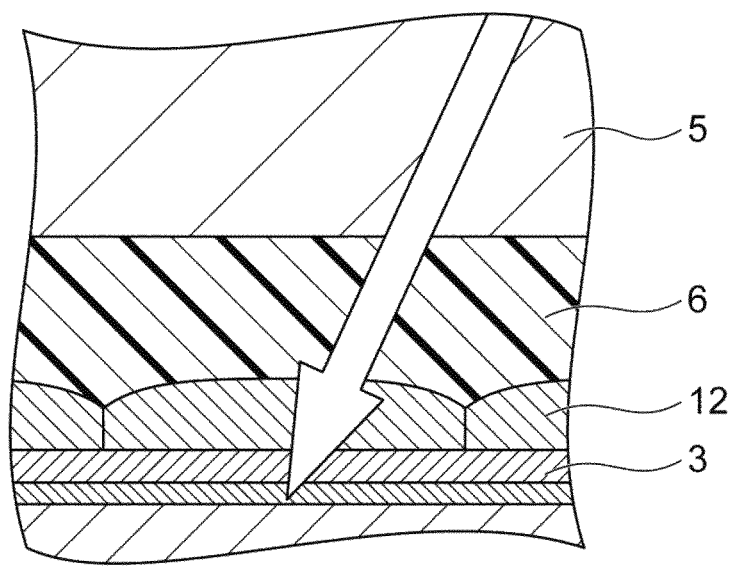
FIG. 6 is a sectional view showing an example of a non-cavity structure.
Figure 7:
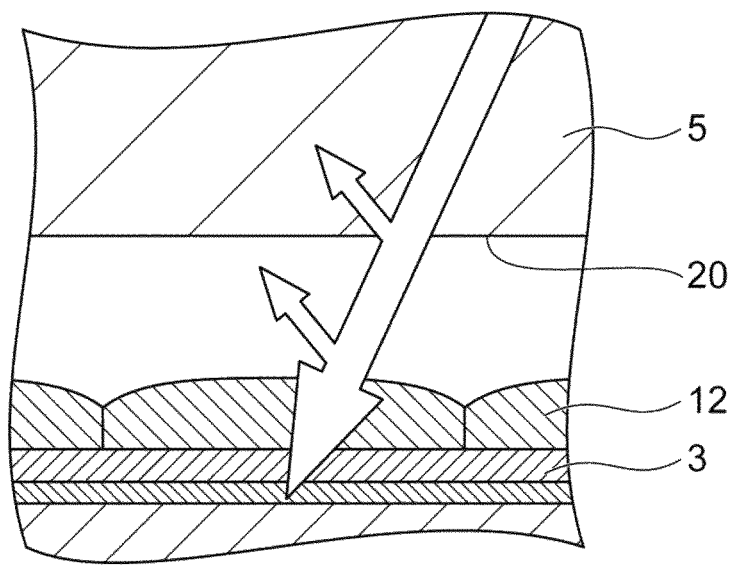
FIG. 7 is a sectional view showing an example of a cavity structure.

FIG. 6 and FIG. 7 are views for illustrating refraction at an interface due to difference in refractive index of cavity in non-cavity structure and a cavity structure. FIG. 6 is a sectional view of an example of a non-cavity structure. FIG. 7 is a sectional view of an example of a cavity structure. In the structure having a cavity, if refractive indexes of individual members significantly differ, incident light is reflected at the interface to produce a problem of optical loss. In contrast, according to the adhesive composition of the embodiment, a refractive index of about nD=1.50 can be obtained, and therefore, provided that the refractive index of the glass substrate 5 is nD=about 1.47; the refractive index of the air layer of the cavity 20 is nD=about 1.00; the refractive index of the microlenses 12 is nD=about 1.60; and the refractive index of the adhesive layer 6 is nD=about 1.50, according to calculation, optical loss due to interface reflection is lower by about 8% in the non-cavity structure of FIG. 6 in comparison with the cavity structure of FIG. 7.

Figure 8:
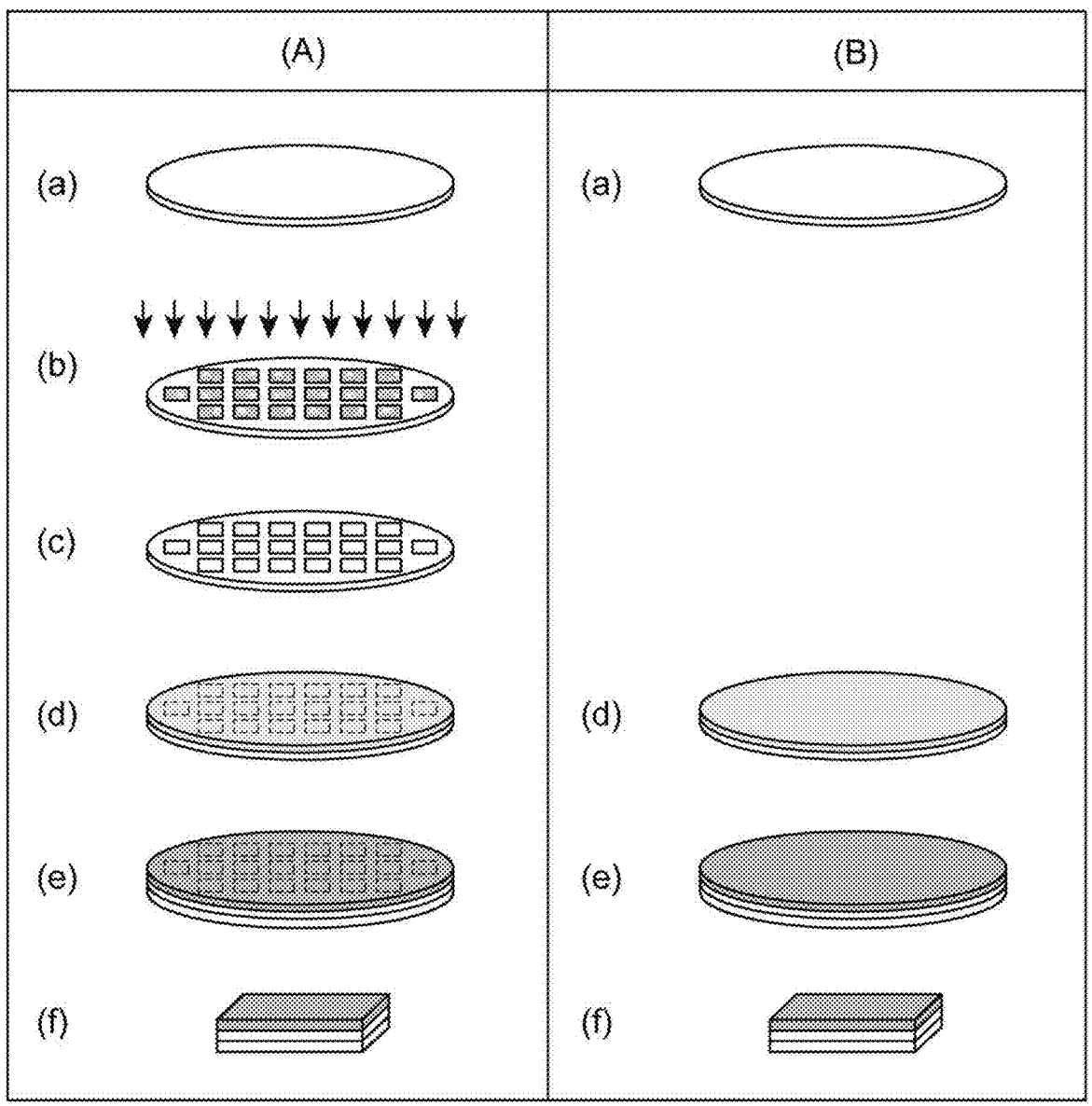
FIG. 8 is a view for comparing methods for producing a semiconductor device.

FIG. 8 is a view for comparing methods for producing a semiconductor device. FIG. 8 (A) shows a conventional method for producing a semiconductor device (rib formation process). FIG. 8 (B) shows the method for producing a semiconductor device (whole surface sealing process) of the first embodiment. The conventional method for producing a semiconductor device requires steps of (a) resin formation (e.g., laminate and spin coat), (b) exposure, (c) developing, (d) glass seal, (e) resin curing and (f) dicing. In contrast, in the method for producing a semiconductor device of first embodiment, the adhesive composition of the embodiment is used, and therefore, formation of a rib (frame like adhesive) is not required, and thus, (b) exposure and (c) developing steps are not required. Owing to this, immediately after an adhesive layer is formed on a semiconductor substrate, sealing with a transparent base material (e.g., glass base material) can be carried out. Thereafter, it is possible to cut into pieces by e.g., dicing.

Figure 9:
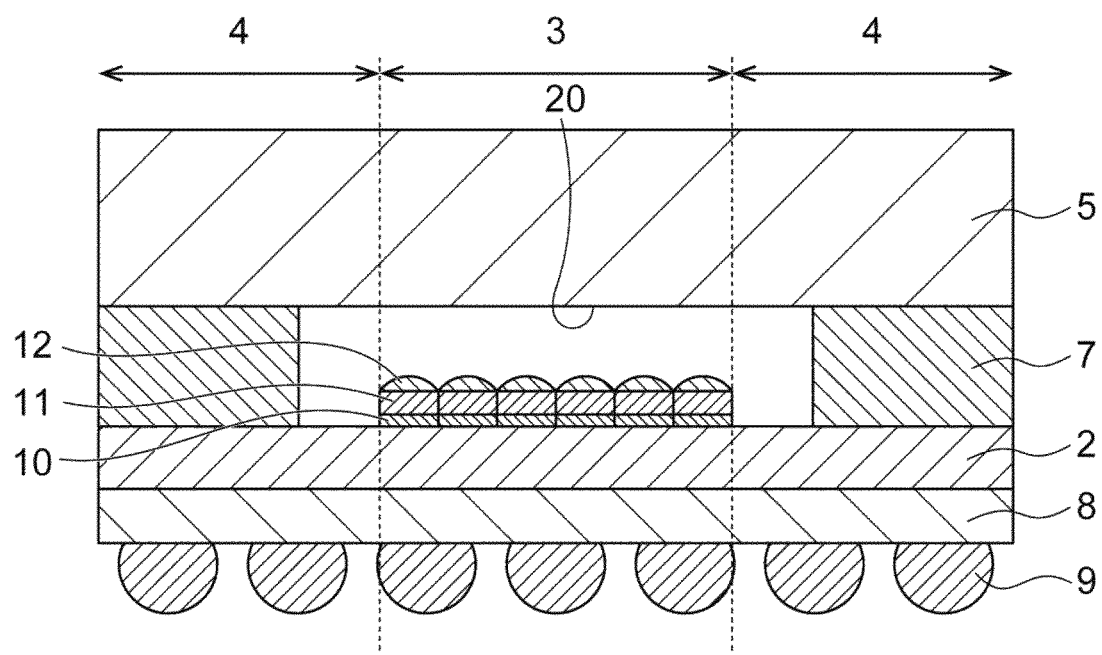
FIG. 9 is a sectional view showing an example of a conventional backside illumination type solid-state imaging device having a cavity structure.

FIG. 9 is a sectional view showing an example of a conventional backside illumination type solid-state imaging device having a cavity structure. In FIG. 9, a cavity 20 is present, which is surrounded by the frame-like adhesive layer 7 and the glass substrate 5, on the silicon substrate 2.

Therefore, in the conventional cavity structure, after a frame-like adhesive is formed by use of photolithography, a printing method, a dispense method or the like, a glass base material and a silicon substrate need to be bonded via the obtained frame-like adhesive. In such a cavity structure, a sealing material as used in the embodiment is not required but a frame-like adhesive is required.

The non-cavity structure using the adhesive composition of the embodiment has the flowing advantages over the conventional cavity structure.

In the cavity structure, if a glass base material has a scratch, image quality may deteriorate due to light scattering, reflection, diffraction and the like. However, if the non-cavity structure of the embodiment is employed, interfacial refractive index difference is reduced and light scattering, reflection, diffraction and the like are suppressed, and therefore, image quality deterioration caused by scratch on the glass base material can be improved.

In the cavity structure, a foreign matter which attaches to a microlens portion, a glass base material or the like serves as a cause for deteriorating image quality. This is because the cavity is exposed in the period between formation of an adhesive and bonding of the glass base material. In this respect, since the exposure time is reduced in the non-cavity structure of the embodiment, attachment of a foreign matter is reduced.

In the non-cavity structure of the embodiment, it is necessary that the adhesive layer is transparent, but the area at which the adhesive layer adheres to the glass base material is large. Because of this, in the non-cavity structure of the embodiment, in comparison with the cavity structure in which the glass base material is bonded by the frame-like adhesive layer alone, stress given by the adhesive within the device does not significantly vary, and therefore, detachment, deformation and the like of the adhesive are reduced.

In the cavity structure, a ray emitted from the glass is received by microlenses, and therefore, image quality may possibly deteriorate, and thus, high purity glass which is expensive must be usually used. In contrast, in the non-cavity structure of the embodiment, since a ray can be absorbed by the adhesive layer, cheap glass can be advantageously used.

For example, a CMOS image sensor which is an example of a semiconductor device of the embodiment is integrated in a mobile phone. In this case, the CMOS image sensor is mounted on the motherboard of a mobile phone via solder balls, and an optical lens is disposed above the sensor (that is, a glass base material side).

Embodiments have been described in the above; however, the present invention is not limited to the embodiments above. For example, with respect to each of the embodiments above, the embodiments which are obtained by appropriately adding, deleting or modifying structural elements, or embodiments which are obtained by adding or deleting steps or modifying the conditions by those skilled in the art may be included in the scope of the invention as long as the embodiments are not against the gist of the present invention.

For example, in the embodiment above, an example of using a glass base material as a transparent base material is shown; however, the present invention is not limited to this, a transparent base material having a necessary strength, rigidity and light transmissivity may be used.

EXAMPLES

Now, the present invention will be more specifically described below based on Examples and Comparative Examples; however, the present invention is not limited to the following Examples.

<Preparation of Adhesive Composition>

Components of Tables 1 and 2 were mixed in accordance with the composition ratios (parts by mass) of Tables 1 and 2 to obtain solutions of adhesive compositions of Examples 1 to 18 and Comparative Examples 1 to 2. Individual components shown in Tables 1 and 2 are as follows.

((Meth)Acrylic Polymer)

(Meth)acrylic polymer (a-1) and (meth)acrylic polymer (a-2) as the component (a) were synthesized by the following procedure.

[(Meth)Acrylic Polymer (a-1)]

300 g of tricyclo[$5.2.1.0^{2,6}$]decan-8-yl acrylate (trade name: FA-513A, Hitachi Chemical Co., Ltd.), 350 g of butyl acrylate (BA), 300 g of butyl methacrylate (BMA), 50 g of glycidyl methacrylate (GMA) and 50 g of 2-ethylhexyl methacrylate (2EHMA) were mixed to obtain a monomer mixture. In the obtained monomer mixture, 5 g of dilauroyl peroxide and 0.45 g of n-octyl mercaptan (chain transfer agent) were dissolved to obtain a mixture.

In a 5 L autoclave equipped with a stirrer and a condenser, 0.44 g of polyvinyl alcohol (suspending agent) and 2000 g of ion exchanged water were added. Then, the mixture above was added while stirring, and polymerization was carried out at a stirring rotation speed of 250 min$^{-1}$ in a nitrogen atmosphere at 60° C. for 5 hours. And then, polymerization was carried out at 90° C. for 2 hours to obtain resin particles (polymerization rate was 99% by mass). These resin particles were washed with water, dewatered and dried to obtain the (meth)acrylic polymer (a-1). The weight average molecular weight of the obtained (meth)acrylic polymer (a-1) was 480000.

[(Meth)Acrylic Polymer (a-2)]

A (meth)acrylic polymer (a-2) was obtained in the same manner as in the case of (meth)acrylic polymer (a-1) except that 220 g of tricyclo[$5.2.1.0^{2,6}$]decan-8-yl acrylate (trade name: FA-513A, Hitachi Chemical Co., Ltd.), 165 g of butyl acrylate (BA), 250 g of butyl methacrylate (BMA), 200 g of glycidyl methacrylate (GMA) and 165 g of 2-ethylhexyl methacrylate (2EHMA) were mixed. The weight average molecular weight of the obtained (meth)acrylic polymer (a-2) was 520000.

The weight average molecular weight of the component (a) was determined by gel permeation chromatography (GPC) with reference to the calibration curve prepared by using the standard polystyrene. The calibration curve is obtained by approximation in accordance with a tertiary expression by using a standard polystyrene kit, PStQuick series C (trade name, Tosoh Corporation). The conditions of GPC are shown below.

Pump: L6000 Pump (Hitachi, Ltd.)
Detector: L3300 RI Monitor (Hitachi, Ltd.)
Column: Gelpack GL-S300MDT-5 (two columns in total) (trade name, Hitachi Chemical Co., Ltd.)
Column size: 8 mm in diameter×300 mm
Eluent: DMF/THF (mass ratio: 1/1)+LiBr·$H_2O$ 0.03 mol/L+$H_3PO_4$ 0.06 mol/L
Sample concentration: 0.1 mass %
Flow rate: 1 mL/min
Measurement temperature: 40° C.

((Meth)Acrylic Monomer)

Dioxane glycol diacrylate (trade name: "A-DOG" (Shin-Nakamura Chemical Co., Ltd.))

Tricyclodecanedimethanol diacrylate (trade name: "A-DCP" (Shin-Nakamura Chemical Co., Ltd.))

Glycidyl methacrylate (GMA, commercialized product: Sigma Aldrich)

(Polymerization Initiator)

PERCUMYL Mill D (trade name, NOF Corporation, thermal polymerization initiator, dicumyl peroxide, 1-hour half-life temperature: 135.7° C., 10-hour half-life temperature: 116.4° C.)

(Filler)

RY200 (trade name, manufactured by Nippon Aerosil Co., Ltd., nano silica filler (amorphous silica), average particle size: 12 nm)

R972 (trade name, manufactured by Nippon Aerosil Co., Ltd., nano silica filler (amorphous silica), average particle size: 16 nm)

SE-2050-SMJ (trade name, manufactured by Admatechs., silica filler (amorphous silica), average particle size: 500 nm, maximum particle size: 3000 nm)

CF0093 (trade name, manufactured by Nippon Frit Co., Ltd., glass filler, average particle size: 3000 nm)

CF0023 (trade name, manufactured by Nippon Frit Co., Ltd., glass filler, average particle size: 10000 nm)

The "glass fillers" contain $SiO_2$ and also contain $ZrO_2$, $B_2O_3$, $Na_2O$, $F_2$, $Al_2O_3$, CaO, MgO, SrO or the like in a predetermined ratio.

(Antioxidant)

Adekastab AO-80 (trade name, ADEKA CORP., hindered phenolic antioxidant, bis[3-(3-tert-butyl-4-hydroxy-5-methylphenyl) propionic acid](2,4,8,10-tetraoxaspiro[5.5]undecane-3, 9-diyl)bis(2,2-dimethyl-2,1-ethanediyl)

Adekastab AO-503 (trade name, ADEKA CORP., thioether antioxidant, ditridecyl 3,3-thiobispropionate)

Karenz MT-NR1 (trade name, KYOEISHA CHEMICAL Co., Ltd., 1,3,5-tris(3-mercaptobutyryloxyethyl)-1,3,5-triazine-2,4,6 (1H, 3H, 5H)-trione)

(Others)

Coupling agent (adhesion aid): 3-(trimethoxysilyl)propyl methacrylate (silane coupling agent, Shin-Etsu Chemical Co., Ltd., trade name: KBM-503)

Epoxy curing agent: 3 or 4-methyl-hexahydrophthalic anhydride (Hitachi Chemical Co., Ltd., trade name: HN-5500)

Epoxy curing accelerator: methyl tributylphosphonium-dimethyl phosphate (Nippon Chemical Industrial Co., Ltd., trade name: HISHICOLIN PX-4MP)

Solvent: PGMEA (Kanto Chemical Co., Inc., chemical substance name: propylene glycol 1-monomethyl ether 2-acetate)

<Evaluation>

(Thixotropic Index)

Thixotropic index (also referred to as "thixotropic degree") refers to ratio of viscosity at the high-speed rotation and viscosity at the low-speed rotation determined by measuring viscosity of a sample at a high-speed rotation and a low-speed rotation by using a predetermined viscometer and corn. Viscosity at a low-speed rotation and viscosity at a high-speed rotation were measured with the conditions shown below and the thixotropic index (T.I) was calculated in accordance with the following formula:

$$T.I = V2/V1$$

V1: Viscosity (P) at a high-speed rotation
V2: Viscosity (P) at a low-speed rotation The following measurement conditions were employed.
(1) Viscometer: EHD type viscometer (Toki Sangyo Co., Ltd.)
(2) Corn: 3° corn
(3) High-speed rotation: 5.0 rpm/3 min
(4) Low-speed rotation: 0.5 rpm/3 min The case where the thixotropic index is 1.3 or more was evaluated as "A"; whereas the case where the thixotropic index is less than 1.3 was evaluated as "B". The evaluation results are shown in Tables 1 and 2.

(Transmissivity)

The adhesive compositions of Examples and Comparative Examples were applied to a detachable PET film using an applicator, and then, dried at 100° C./10 minutes to form film-like resin films having a thickness of 100 µm. Subsequently, a detachable PET film was attached using a roll laminator at 90° C. to obtain laminates having a three-layer structure consisting of PET film/resin film/PET film. As the detachable PET film, FILMBYNA 38E-0010GC manufactured by Fujimori Kogyo Co., Ltd., was used. Thereafter, the resin film was cured at 150° C. for one hour and at 180° C. for one hour. The film-like cured film was removed from the PET film to obtain a single-layer cured film. The transmissivity of the cured films at 25° C. were measured. Specifically, transmissivity within the wavelength range of 800 to 300 nm was measured by using a spectrophotometer U4100 (trade name, Hitachi, Ltd., initiation 800 nm, final 300 nm, scan speed 600 nm/min, sampling interval 1.0 nm). Note that, a base line was specified as Air. The measurement results were evaluated based on the following criteria. The evaluation results are shown in Tables 1 and 2.

A: Transmissivity at a wavelength of 400 nm is 90% or more.
B: Transmissivity at a wavelength of 400 nm is 85% or more and less than 90.
C: Transmissivity at a wavelength of 400 nm is less than 85%.

(Refractive Index)

The adhesive compositions of Examples were applied to a detachable PET film using an applicator, and then, dried at 100° C./10 minutes to form film-like resin films having a thickness of 100 µm. Subsequently, a detachable PET film was attached using a roll laminator at 90° C. to obtain laminates having three-layer structure consisting of PET film/resin film/PET film. As the detachable PET film, FILMBYNA 38E-0010GC manufactured by Fujimori Kogyo Co., Ltd., was used. Thereafter, the resin film was cured at 150° C. for one hour and at 180° C. for one hour. The film-like cured films was removed from the PET film to obtain a single-layer cured film. The refractive indexes of the cured films were measured. Specifically, a cured film was placed on the main prism of a multi-wavelength Abbe refractometer (manufactured by Atago, DR-M2 (trade name)) and refractive index (wavelength 589.3 nm (sodium D line)) at 25° C. was measured by using lightning glass and a monobromonaphthalene solution (interference liquid). Measurement was carried out in a light transmissible system. The temperature of the cured film was controlled by controlling the temperature of a constant temperature water tank attached to the refractometer. "Abbe refractometer" is a refractometer for obtaining a refractive index based on the position of the critical angle. The refractive indexes were all from 1.49 to 1.50.

(Peeling Resistance During a Reflow Process)

The adhesive compositions of Examples were uniformly applied to a silicon wafer having a thickness of 400 µm by a spin coater, and then, dried on a hot plate of 100° C. for 10 minutes to form test substrates having an adhesive layer of 50 µm in thickness. To the adhesive layer of the obtained test substrates, a glass substrate (trade name: MATSUNAMI MICRO COVER GLASS, 40 mm×50 mm THICKNESS No. 1: Matsunami Glass Ind., Ltd.) having 4.0 cm×5.0 cm×120 to 170 µm (actual measurement: 140 to 160 µm) was attached by a roll laminator, followed by heating at 150° C. for one hour and at 180° C. for one hour for curing. These test substrates were allowed to stand still on a hot plate of 260° C. for 30 seconds, and then, transferred to room temperature (25° C.) and allowed to stand still there for 5 minutes. The appearance of the test substrates was visually observed. No abnormal appearance was observed.

TABLE 1

| Item | | Example | | | | | | | | | |
|------|------|---|---|---|---|---|---|---|---|---|---|
| Material | Article name | 1 | 2 | 3 | 4 | 5 | 6 | 7 | 8 | 9 | 10 |
| (Meth)acrylic polymer | a-1 | 100 | 100 | 100 | 100 | 100 | 100 | 100 | 100 | 100 | 100 |
| | a-2 | | | | | | | | | | |
| (Meth)acrylic monomer | A-DOG | 100 | 100 | 100 | 100 | 100 | 100 | 100 | 100 | 100 | 100 |
| | A-DCP | | | | | | | | | | |
| | GMA | | | | | | | | | | |
| Polymerization initiator | PERCUMYL D | 2 | 2 | 2 | 2 | 2 | 2 | 2 | 2 | 2 | 2 |
| Filler (average particle size) | RY200 (12 nm) | | | | | | | | | | |
| | R972 (16 nm) | 1 | 5 | 10 | 20 | | | | | | |
| | SE-2050-SMJ (500 nm) | | | | | | | | | | |
| | CF0093 (3000 nm) | | | | | 5 | 10 | 20 | | | |

TABLE 1-continued

| Material | Article name | 1 | 2 | 3 | 4 | 5 | 6 | 7 | 8 | 9 | 10 |
|---|---|---|---|---|---|---|---|---|---|---|---|
| | CF0023 (10000 nm) | | | | | | | | 5 | 10 | 20 |
| Antioxidant | AO-80 | 5 | 5 | 5 | 5 | 5 | 5 | 5 | 5 | 5 | 5 |
| | AO-503 | 1 | 1 | 1 | 1 | 1 | 1 | 1 | 1 | 1 | 1 |
| | MT-NR1 | 1 | 1 | 1 | 1 | 1 | 1 | 1 | 1 | 1 | 1 |
| Coupling agent | KBM-503 | 2 | 2 | 2 | 2 | 2 | 2 | 2 | 2 | 2 | 2 |
| Epoxy curing agent | HN5500 | | | | | | | | | | |
| Epoxy curling accelerator | PX-4MP | | | | | | | | | | |
| Solvent | PGMEA | 200 | 200 | 200 | 200 | 200 | 200 | 200 | 200 | 200 | 200 |
| Evaluation result | | | | | | | | | | | |
| Thixotropic index | Result (unit: —) | 1.3 | 1.4 | 1.6 | 2.1 | 1.3 | 1.5 | 1.6 | 1.3 | 1.4 | 1.5 |
| | Evaluation | A | A | A | A | A | A | A | A | A | A |
| Transmissivity (@400 nm) | Result (unit: %) | 91.0 | 90.6 | 90.4 | 90.4 | 90.3 | 90.1 | 90.0 | 90.7 | 90.2 | 90.0 |
| | Evaluation | A | A | A | A | A | A | A | A | A | A |

TABLE 2

| Material | Article name | 11 | 12 | 13 | 14 | 15 | 16 | 17 | 18 | Comparative Example 1 | Comparative Example 2 |
|---|---|---|---|---|---|---|---|---|---|---|---|
| (Meth)acrylic polymer | a-1 | 100 | 100 | 100 | 100 | 100 | | | | 100 | |
| | a-2 | | | | | | 100 | 100 | 100 | | 100 |
| (Meth)acrylic monomer | A-DOG | 100 | 100 | 100 | 100 | 100 | | | | 100 | |
| | A-DCP | | | | | | 100 | 100 | 100 | | 100 |
| | GMA | | | | | | 25 | 25 | 25 | | 25 |
| Polymerization initiator | PERCUMYL D | 2 | 2 | 2 | 2 | 2 | 2 | 2 | 2 | | 2 |
| Filler (average particle size) | RY200 (12 nm) | 1 | 5 | 10 | 20 | | | | | | |
| | R972 (16 nm) | | | | | | 5 | 10 | 20 | | |
| | SE-2050-SMJ (500 nm) | | | | | 10 | | | | | |
| | CF0093 (3000 nm) | | | | | | | | | | |
| | CF0023 (10000 nm) | | | | | | | | | | |
| Antioxidant | AO-80 | 5 | 5 | 5 | 5 | 5 | 5 | 5 | 5 | 5 | 5 |
| | AO-503 | 1 | 1 | 1 | 1 | 1 | 1 | 1 | 1 | 1 | 1 |
| | MT-NR1 | 1 | 1 | 1 | 1 | 1 | 1 | 1 | 1 | 1 | 1 |
| Coupling agent | KBM-503 | 2 | 2 | 2 | 2 | 2 | 2 | 2 | 2 | 2 | 2 |
| Epoxy curing agent | HN5500 | | | | | | 14.8 | 14.8 | 14.8 | | 14.8 |
| Epoxy curling accelerator | PX-4MP | | | | | | 0.2 | 0.2 | 0.2 | | 0.2 |
| Solvent | PGMEA | 200 | 200 | 200 | 200 | 200 | 200 | 200 | 200 | 200 | 200 |
| Evaluation result | | | | | | | | | | | |
| Thixotropic index | Result (unit: —) | 1.4 | 1.6 | 2.1 | 3.2 | 1.4 | 1.4 | 1.5 | 1.8 | 1.0 | 1.0 |
| | Evaluation | A | A | A | A | A | A | A | A | B | B |
| Transmissivity (@400 nm) | Result (unit: %) | 91.0 | 90.6 | 90.3 | 90.0 | 90.0 | 90.0 | 90.0 | 91.0 | 91.3 | 90.0 |
| | Evaluation | A | A | A | A | A | A | A | A | A | A |

As shown in the evaluation results, the adhesive compositions of Examples have excellent viscosity (thixotropic index) and transparency. According to the adhesive compositions of Examples, cured articles having excellent refractive index and peeling resistance during a reflow process (260° C.) can be obtained.

REFERENCE SIGNS LIST

1 . . . CMOS image sensor, 2 . . . Silicon substrate, 3 . . . Sensor section, 4 . . . Peripheral circuit section, 5 . . . Glass substrate, 6, 37, 37a . . . Adhesive layer, 7 . . . Frame-like adhesive layer, 8 . . . Wiring layer, 9 . . . Solder ball, 10 . . . Photodiode, 11 . . . Color filter, 12 . . . Microlens, 20 . . . Cavity, 30 . . . Semiconductor device, 31 . . . Support base material, 33 . . . Semiconductor substrate, 35 . . . Wire, 39 . . . Transparent base material.

The invention claimed is:

1. An adhesive composition comprising:
   (a) a (meth)acrylic polymer;
   (b) a compound having at least two (meth)acryloyl groups, a content of the compound (b) relative to a total of 100 parts by mass of the component (a) and the component (b) being 20 parts by mass or more;
   (c) a polymerization initiator; and
   (d) a filler.

2. The adhesive composition according to claim 1, wherein a content of the component (d) relative to the total of 100 parts by mass of the component (a) and the component (b) is 0.1 to 40 parts by mass.

3. The adhesive composition according to claim 1, wherein an average particle size of the component (d) is 5 to 10000 nm.

4. The adhesive composition according to claim 1, wherein the component (a) has an alicyclic structure.

5. The adhesive composition according to claim 1, wherein the component (a) has an epoxy group.

6. The adhesive composition according to claim 1, wherein the component (a) has a structural unit represented by the following general formula (1):

Chemical Formula 1

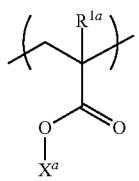
(I)

wherein, in formula (I), $R^{1a}$ represents a hydrogen atom or a methyl group, and $X^a$ represents a group containing an epoxy group.

7. The adhesive composition according to claim 1, further comprising an antioxidant.

8. A cured article of the adhesive composition according to claim 1.

9. A method for producing a semiconductor device, comprising:
    a step of forming an adhesive layer containing the adhesive composition according to claim 1 on a semiconductor substrate; and
    a step of curing the adhesive layer in a state that the adhesive layer is disposed between the semiconductor substrate and a transparent base material.

10. A semiconductor device comprising:
    a semiconductor substrate;
    an adhesive layer disposed on the semiconductor substrate; and
    a transparent base material bonded to the semiconductor substrate via the adhesive layer, wherein
    the adhesive layer contains the adhesive composition according to claim 1 or a cured article thereof.

11. The semiconductor device according to claim 10, which is optical part.

12. The adhesive composition according to claim 1, wherein a weight average molecular weight of the component (a) is 100000 or more.

13. The adhesive composition according to claim 12, wherein the content of the component (b) relative to the total of 100 parts by mass of the component (a) and the component (b) is 30 parts by mass or more.

14. The adhesive composition according to claim 12, wherein an average particle size of the component (d) is 500 nm or less.

15. The adhesive composition according to claim 14, wherein a content of the component (d) relative to the total of 100 parts by mass of the component (a) and the component (b) is 5 parts by mass or more.

16. The adhesive composition according to claim 1, wherein a weight average molecular weight of the component (a) is 200000 or more.

17. The adhesive composition according to claim 16, wherein a content of the component (d) relative to the total of 100 parts by mass of the component (a) and the component (b) is 5 parts by mass or more.

18. The adhesive composition according to claim 1, wherein a weight average molecular weight of the component (a) is 400000 or more.

19. The adhesive composition according to claim 1, wherein a content of the component (d) relative to Han the total of 100 parts by mass of the component (a) and the component (b) is 0.1 parts by mass or more.

* * * * *